US00RE49538E

(19) United States
(12) Reissued Patent
Na et al.

(10) Patent Number: US RE49,538 E
(45) Date of Reissued Patent: May 30, 2023

(54) SEMICONDUCTOR DEVICE AND METHOD OF FABRICATING THE SAME

(71) Applicant: Samsung Electronics Co., Ltd., Suwon-si (KR)

(72) Inventors: Hoonjoo Na, Seoul (KR); Sangjin Hyun, Suwon-si (KR); Yugyun Shin, Seongnam-si (KR); Hongbae Park, Seoul (KR); Sughun Hong, Yongin-si (KR); Hye-Lan Lee, Hwasung-si (KR); Hyung-Seok Hong, Ansan-si (KR)

(73) Assignee: Samsung Electronics Co., Ltd., Gyeonggi-do (KR)

(21) Appl. No.: 17/070,488

(22) Filed: Oct. 14, 2020

Related U.S. Patent Documents

Reissue of:
(64) Patent No.: 8,766,366
Issued: Jul. 1, 2014
Appl. No.: 13/633,663
Filed: Oct. 2, 2012

U.S. Applications:
(62) Division of application No. 13/069,848, filed on Mar. 23, 2011, now Pat. No. 8,309,411.

(30) Foreign Application Priority Data

Mar. 24, 2010 (KR) ..... 10-2010-0026431

(51) Int. Cl.
*H01L 29/49* (2006.01)
*H01L 21/28* (2006.01)
*H01L 21/8234* (2006.01)

(52) U.S. Cl.
CPC ..... *H01L 21/28* (2013.01); *H01L 29/49* (2013.01); *H01L 21/8234* (2013.01)

(58) Field of Classification Search
CPC ..... H01L 21/823842; H01L 29/66545; H01L 21/336; H01L 21/3213; H01L 21/28114; H01L 29/42376; H01L 29/495; H01L 29/4966
See application file for complete search history.

(56) References Cited

U.S. PATENT DOCUMENTS 6,200,865 B1 * 3/2001 Gardner et al. ..... 438/291
6,573,134 B2 6/2003 Ma et al.
6,872,627 B2 3/2005 Chen et al.
7,871,915 B2 1/2011 Lim et al.
(Continued)

FOREIGN PATENT DOCUMENTS

JP 2000-307010 A 11/2000
KR 2006-0077786 A 7/2006

*Primary Examiner* — Tuan H Nguyen
(74) *Attorney, Agent, or Firm* — Harness, Dickey & Pierce, P.L.C.

(57) ABSTRACT

A method of fabricating a semiconductor device includes forming an interlayer dielectric on a substrate, the interlayer dielectric including first and second openings respectively disposed in first and second regions formed separately in the substrate; forming a first conductive layer filling the first and second openings; etching the first conductive layer such that a bottom surface of the first opening is exposed and a portion of the first conductive layer in the second opening remains; and forming a second conductive layer filling the first opening and a portion of the second opening.

25 Claims, 20 Drawing Sheets

(56) References Cited

U.S. PATENT DOCUMENTS

| | | | | |
|---|---|---|---|---|
| 7,892,914 | B2 | 2/2011 | Nakamura et al. | |
| 7,915,105 | B2 | 3/2011 | Yeh et al. | |
| 8,329,546 | B2 * | 12/2012 | Lee | H01L 21/28114 438/585 |
| 2002/0024091 | A1 * | 2/2002 | Mo | 257/330 |
| 2003/0143825 | A1 | 7/2003 | Matsuo et al. | |
| 2005/0153530 | A1 * | 7/2005 | Ku et al. | 438/587 |
| 2005/0224886 | A1 * | 10/2005 | Doyle et al. | 257/368 |
| 2008/0079084 | A1 | 4/2008 | Hanafi | |
| 2009/0057788 | A1 * | 3/2009 | Hattendorf et al. | 257/412 |
| 2009/0087974 | A1 | 4/2009 | Waite et al. | |
| 2009/0230479 | A1 | 9/2009 | Hsu et al. | |
| 2010/0065926 | A1 * | 3/2010 | Yeh et al. | 257/410 |
| 2010/0102399 | A1 | 4/2010 | Hyun et al. | |
| 2011/0079828 | A1 | 4/2011 | Anderson et al. | |
| 2011/0136313 | A1 * | 6/2011 | Lee | H01L 29/66583 257/E21.177 |
| 2011/0147831 | A1 * | 6/2011 | Steigerwald et al. | 257/330 |
| 2011/0248359 | A1 | 10/2011 | Hwang et al. | |
| 2012/0231626 | A1 * | 9/2012 | Lee et al. | 438/653 |
| 2013/0092992 | A1 * | 4/2013 | Chang et al. | 257/301 |
| 2013/0178033 | A1 * | 7/2013 | Bohr et al. | 438/299 |

* cited by examiner

SEMICONDUCTOR DEVICE AND METHOD OF FABRICATING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This [U.S. non-provisional patent application] *application is a reissue application for U.S. Pat. No. 8,766,366 issued on Jul. 2, 2014, which* is a divisional [application] of U.S. application Ser. No. 13/069,848, filed Mar. 23, 2011, now [allowed] *U.S. Pat. No. 8,309,411*, which claims priority under 35 U.S.C. § 119 of Korean Patent Application No. 10-2010-0026431, filed on Mar. 24, 2010, the entire contents of each of which are hereby incorporated by reference.

BACKGROUND

1. Field

The present invention herein relates to a semiconductor device and a method of fabricating the same.

2. Description of the Related Art

Generally, Complementary Metal Oxide Silicon (CMOS) semiconductor devices simultaneously include N-channel Metal Oxide Silicon (NMOS) transistors and P-channel Metal Oxide Silicon (PMOS) transistors. Electrons are accumulated in the channels of the NMOS transistors, and holes are accumulated in the channels of the PMOS transistors.

As electronic industries are highly developed, a degree of integration of CMOS included in semiconductor devices increases, and requirements for high-speed CMOS are increasing. Accordingly, much research is being made for implementing CMOS that has improved integration and/or speed.

SUMMARY

The present invention provides a semiconductor device having increased reliability and a method of fabricating the same. The present invention also provides a semiconductor device having improved integration and/or speed and a method of fabricating the same.

An example embodiment of the inventive concepts provides a method of fabricating semiconductor device including forming an interlayer dielectric on a substrate, the inter-layer dielectric including first and second openings respectively disposed in first and second regions formed separately in the substrate, forming a first conductive layer filling the first and second openings, etching the first conductive layer such that a bottom surface of the first opening is exposed and a portion of the first conductive layer in the second opening remains, and forming a second conductive layer filling the first opening and a portion of the second opening.

In an example embodiment, etching the first conductive layer may include forming a mask pattern covering the first conductive layer on the second region, performing a first etching process on the first conductive layer on the first region using the mask pattern, removing the mask pattern, and performing a second etching process to remove a portion of the first conductive layer remaining in the first opening after the performing the first etching process and to remove a portion of the first conductive layer in the second opening.

In another example embodiment, the method may further include etching the second conductive layer to remove a portion of the second conductive layer in the first opening and expose the remaining portion of the first conductive layer in the second opening.

In another example embodiment, the method may further include forming a third conductive layer on the second conductive layer remaining in the first opening and on the first conductive layer remaining in the second opening, the third conductive layer filling upper regions of the first and second openings. In another example embodiment, the third conductive layer may have a lower resistivity than the first and second conductive layers.

In another example embodiment, the first conductive layer is conformally formed in the second opening, the first conductive layer having a thickness less than one-half of a width of the second opening, and the second conductive layer is conformally formed in the first opening, the second conductive layer having a thickness less than one-half of a width of the first opening.

In another example embodiment, after the forming the second conductive layer, the second conductive layer remaining in the first opening includes a bottom portion on a bottom surface of the first opening and a sidewall portion on a sidewall of the first opening, the sidewall portion having a top surface lower than a top surface of the interlayer dielectric, and the first conductive layer remaining in the second opening includes a bottom portion on a bottom surface of the second opening and a sidewall portion on a sidewall of the second opening, the sidewall portion having a top surface lower than the top surface of the interlayer dielectric.

In another example embodiment, the forming the interlayer dielectric may include forming first and second gate dielectric patterns and first and second dummy gate pattern sequentially stacked on the respective first and second regions of the substrate, the first and second gate dielectric patterns including first and second insulation patterns and first and second metal compound patterns on the first and second insulation patterns, respectively, forming an interlayer dielectric material on the substrate and sidewalls of the first and second dummy gate patterns and removing the first and second dummy gate patterns to form the first and second openings.

In another example embodiment, the removing the first and second dummy gate patterns includes etching the first and second dummy gate patterns using the respective first and second metal compound patterns to expose the first and second gate dielectric patterns disposed on the respective first and second regions of the substrate. In another example embodiment, a work function of the first conductive layer and a work function of the second conductive layer may be different from each other.

In another example embodiment of the inventive concepts, a method of fabricating semiconductor device includes forming an interlayer dielectric on a substrate, the interlayer dielectric including an opening, conformally forming a first conductive layer on a bottom surface and side wall of the opening, etching the first conductive layer to remove a portion of the first conductive layer from an upper region of the opening such that the first conductive layer remains on a bottom portion of a bottom surface of the opening and on a sidewall portion on a sidewall of the opening, and a top surface of the sidewall portion is lower than a top surface of the interlayer dielectric and forming a second conductive layer filling the upper region of the opening.

In another example embodiment, the forming of the inter-layer dielectric may include forming a gate dielectric pattern on the substrate, the gate dielectric pattern including an insulation pattern and a metal compound pattern on the insulation pattern, forming a dummy gate pattern on the gate dielectric pattern, forming an interlayer dielectric material on the substrate and sidewalls of the dummy gate pattern and removing the dummy gate pattern.

In another example embodiment, the removing the dummy gate pattern includes etching the dummy gate pattern using the metal compound pattern to expose the gate dielectric pattern. In another example embodiment, a thickness of the first conductive layer may be less than one-half of a width of the opening. In another example embodiment, the second conductive layer may have a lower resistivity than the first conductive layer. In another example embodiment, etching the first conductive layer may be performed in an anisotropic etching process.

In another example embodiment of the inventive concepts, a semiconductor device includes a gate dielectric pattern disposed on a substrate, a lower gate electrode disposed on the gate dielectric pattern, the lower gate electrode including a bottom portion parallel to the substrate and sidewall portions extending in a vertical direction from both ends of the bottom portion and an upper gate electrode disposed on the bottom portion and sidewall portions of the lower gate electrode, the upper gate electrode having a lower resistivity than the lower gate electrode.

In another example embodiment, the upper gate electrode may be partially surrounded by the sidewall portions of the lower gate electrode. In another example embodiment, a width of upper portions of the sidewall portions of the lower gate electrode may be narrower than a width of lower portions of the sidewall portions of the lower gate electrode.

BRIEF DESCRIPTION OF THE DRAWINGS

The accompanying drawings are included to provide a further understanding of the inventive concepts, and are incorporated in and constitute a part of this specification. The drawings illustrate example embodiments of the inventive concepts and, together with the description, serve to explain principles of the inventive concepts. In the drawings.

DETAILED DESCRIPTION OF EXAMPLE EMBODIMENTS

Figure 1A:
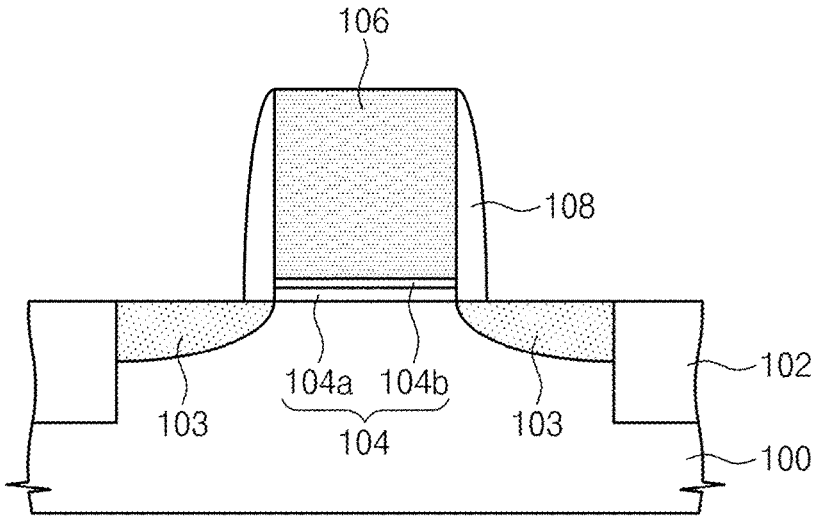
FIGS. 1A to 1D are cross-sectional views for describing a method of fabricating semiconductor device according to an example embodiment of the inventive concepts.

Example embodiments of the inventive concepts will be described below in more detail with reference to the accompanying drawings. The inventive concepts may, however, be embodied in different forms and should not be construed as limited to the example embodiments set forth herein. Rather, these example embodiments are provided so that this disclosure will be thorough and complete, and will fully convey the scope of the inventive concepts to those skilled in the art.

In the specification, it will be understood that when a layer (or film) is referred to as being 'on' another layer or substrate, it can be directly on the other layer or substrate, or intervening layers may also be present. Also, in the figures, the dimensions of layers and regions are exaggerated for clarity of illustration. Also, though terms like a first, a second, and a third are used to describe various regions and layers in various example embodiments the regions and the layers are not limited to these terms. These terms are used only to discriminate one region or layer from another region or layer. Therefore, a layer referred to as a first layer in one example embodiment can be referred to as a second layer in another example embodiment. An example embodiment described and exemplified herein includes a complementary embodiment thereof. In the specification, the term 'and/or' is used as meaning in which the term includes at least one of preceding and succeeding elements. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to longitudinal sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a method of fabricating semiconductor device according to an embodiment of the inventive concepts will be described in detail. FIGS. 1A to 1D are cross-sectional views for describing a method of fabricating semiconductor device according to an example embodiment of the inventive concepts.

Referring to FIG. 1A, a substrate 100 is provided. The substrate 100 may be a semiconductor substrate. For example, the substrate 100 may be a silicon substrate, a germanium substrate, a silicon-germanium substrate, or a compound semiconductor substrate. The substrate 100 may be doped with a first conductive type dopant.

A device isolation pattern 102 is formed on the substrate 100, and thus an active region may be defined. The active region is a portion of the substrate 100 that is surrounded by the device isolation pattern 102. The device isolation pattern 102 may be formed by forming a trench on the substrate 100 and filling the trench with an insulating material.

A gate dielectric pattern 104 and a dummy gate pattern 106 may be sequentially stacked on the active region. The gate dielectric pattern 104 may include at least one that is selected from among a silicon oxynitride layer, a silicon nitride layer, a silicon oxide layer, or a metal oxide layer. The gate dielectric pattern 104 may have multi layers. For example, the gate dielectric pattern 104 may include an insulation pattern 104a, and a metal compound pattern 104b on the insulating pattern 104a. The insulation pattern 104a may include any one of a silicon oxide layer, a silicon nitride layer, or a silicon oxynitride layer. The metal compound pattern 104b may include any one of a metal oxide layer, a metal silicide layer, a metal nitride layer, or a metal oxynitride layer.

The dummy gate pattern 106 and the gate dielectric pattern 104 may be formed of a material having an etch selectivity. For example, the dummy gate pattern 106 may be formed of silicon.

A spacer 108 covering the sidewall of the dummy gate pattern 106 and the sidewall of the gate dielectric pattern 104 may be formed. Forming the spacer 108 may include forming a spacer layer on the substrate 100, and anisotropically etching the spacer layer The spacer 108 may be formed of an insulating material having an etch selectivity with respect to the dummy gate pattern 106.

Source and drain regions 103 may be formed in the active region of the substrate 100 on both sides of the dummy gate pattern 106 and gate dielectric pattern 104. The source and drain regions 103 may be regions that are doped with a second conductive type dopant.

Figure 1B:
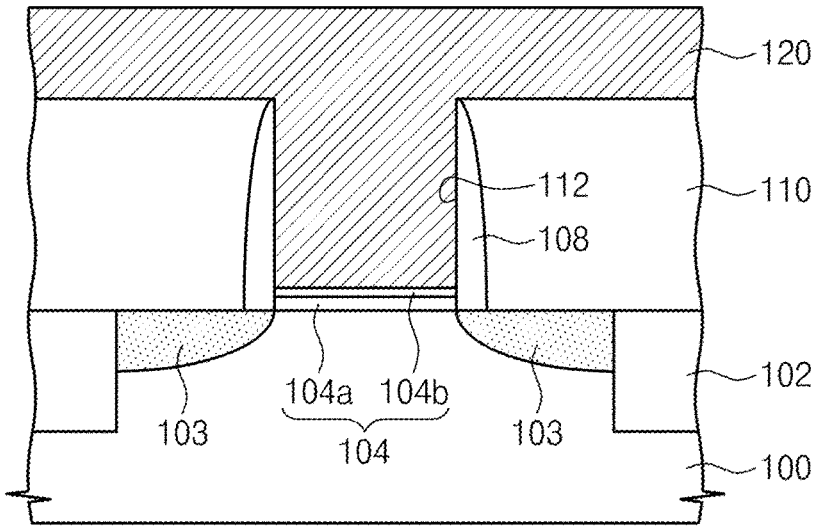

Referring to FIG. 1B, an interlayer dielectric (not shown) may be formed on the substrate 100. After forming the interlayer dielectric, a planarization process may be performed for the interlayer dielectric by using the upper surface of the dummy gate pattern 106 as an etch stop layer. The upper surface of the planarized interlayer dielectric 110 and the upper surface of the dummy gate pattern 106 may be coplanar. The planarization process may be performed in an etch-back process or a Chemical Mechanical Polishing (CMP) process. The upper surface of the dummy gate pattern 106 may be exposed by the planarization process.

The exposed dummy gate pattern 106 may be removed, and then the dummy gate pattern 106 may be completely removed. Removing the dummy gate pattern 106 may include etching the dummy gate pattern 106 by using the metal compound pattern 104b of the gate dielectric pattern 104 as an etch stop layer. The dummy gate pattern 106 is removed, and thus, an opening 112 exposing the gate dielectric pattern 104 may be formed The bottom surface of the opening 112 may be composed of the upper surface of the gate dielectric pattern 104, and the sidewalls of the opening 112 may be composed of the sidewalls of the spacers 108.

A first conductive layer 120 may be formed which fills the opening 112 and may cover the upper surface of the interlayer dielectric 110. The first conductive layer 120 may completely fill the opening 112.

A portion of the first conductive layer 120 in the opening 112 may be included in the gate of a transistor. The first conductive layer 120 may include a conductive material having a work function required by the transistor. For example, when the transistor is an NMOS transistor, the first conductive layer 120 may include a metal-containing material having a work function that is relatively close to the lower-end edge of the conductive band of a semiconductor (for example, silicon) from among the lower-end edge of the conductive band and the upper-end edge of the valence band of the semiconductor. The semiconductor may be one constituting the substrate 100. In another example embodiment, when the transistor is a PMOS transistor, the first conductive layer 120 may include a metal-containing material having a work function that is relatively close to the upper-end edge of the valence band of the semiconductor from among the lower-end edge of the conductive band and the upper-end edge of the valence band.

The first conductive layer 120 may include a metal-containing layer. For example, the first conductive layer 120 may include any one of a titanium nitride layer, a titanium silicide layer, a titanium aluminum nitride layer, a tantalum nitride layer, a titanium tantalum nitride layer, a tantalum aluminum nitride layer, or a tantalum silicide nitride layer. The work function of the first conductive layer 120 may be controlled according to a composition ratio of materials constituting the first conductive layer 120. For example, when the first conductive layer 120 is formed as a titanium nitride layer, the titanium concentration of a case where the transistor is an NMOS transistor is higher than that of a case where the transistor is a PMOS transistor, and the nitrogen concentration of a case where the transistor is an NMOS transistor is lower than that of a case where the transistor is a PMOS transistor.

Figure 1C:
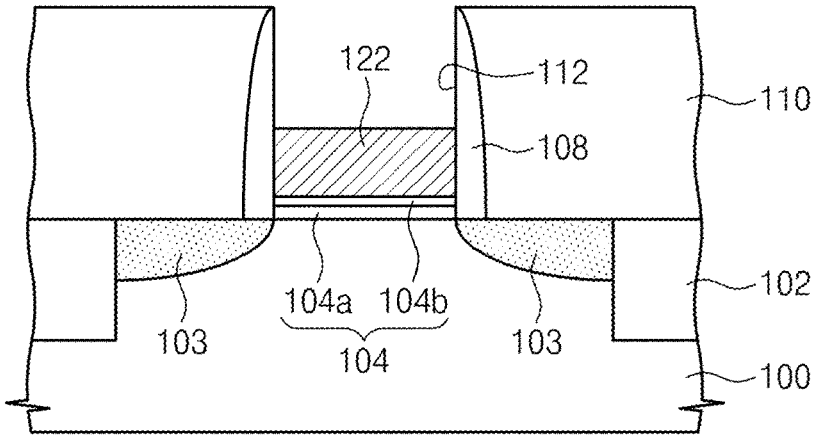

Referring to FIG. 1C, the first conductive layer 120 may be etched. The first conductive layer 120 may be etched in a wet etching process and/or a dry etching process. Therefore, the first conductive layer 120 formed on the interlayer dielectric 110 may be removed, the first conductive layer 120 disposed in an upper region of the opening 112 may be removed, and a portion of the first conductive layer 120 disposed in a lower region of the opening 112 may remain. As a result, a lower gate electrode 122 may be formed which fills the lower region of the opening 112. A channel region is defined in an active region under the lower gate electrode 122.

The upper surface of the lower gate electrode 122 may be lower than the upper surface of the interlayer dielectric 110. Consequently, an upper portion of the sidewall of the opening 112 may be exposed. The bottom surface of the opening 112 and a lower portion of the sidewall of the opening 112 may be covered by the lower gate electrode 122. The lower region of the opening 112 may be filled by the lower gate electrode 122, and the upper region of the opening 112 may be empty. The lower gate electrode 122 may be formed to have a thickness where the work function of the first conductive layer 120 may sufficiently affect the channel region.

Figure 1D:
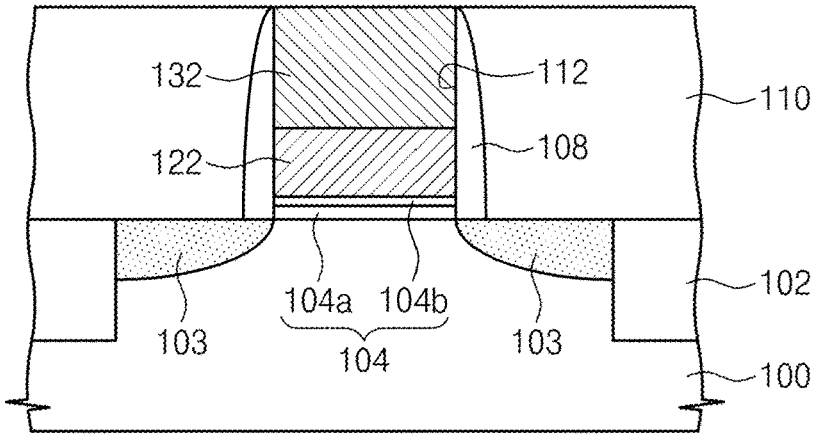

Referring to FIG. 1D, an upper gate electrode 132 may be formed which fills the empty upper region of the opening 112. The upper gate electrode 132 may be formed by forming a second conductive layer filling the opening 112 and planarizing the second conductive layer until the upper surface of the interlayer dielectric 110 is exposed. The upper gate electrode 132 may be a portion of the second conductive layer filling the empty upper region of the opening 112. A planarization process for the second conductive layer may be performed in an etch-back process or a CMP process.

The entire area of the lower surface of the upper gate electrode 132 may be the same as that of the upper surface of the lower gate electrode 122. The upper gate electrode 132 may include a material having a lower resistivity than the lower gate electrode 122. The upper gate electrode 132 may include a metal-containing layer. For example, the upper gate electrode 132 may include any one of aluminum, aluminum alloy, tungsten and copper.

According to an example embodiment of the inventive concepts, the lower gate electrode 122 may be formed to have a work function required by a transistor, and the upper gate electrode 132 may be formed of a material having a lower resistivity. Therefore, the lower and upper gate electrodes 122 and 132 according to an example embodiment of the inventive concepts minimize or reduce a resistance and have a work function required by the transistor. Thus, a semiconductor device having a higher speed operation may be implemented. Also, the aspect ratio of the empty upper region of the opening 112 is relatively low in which the upper gate electrode 132 is formed, and thus, the second conductive layer fills the empty upper region of the opening 112 without a void and/or seam. Accordingly, the defects of the gate electrodes 122 and 132 are minimized or reduced and a more reliable semiconductor device is implemented.

Hereinafter, a semiconductor device formed by the method of fabricating semiconductor device according to an example embodiment of the inventive concepts will be described with reference to FIG. 1D.

Referring to FIG. 1D, the substrate 100 may include an active region that is defined by the device isolation pattern 102. The gate dielectric pattern 104 may be disposed on the substrate 100, and the gate electrodes 122 and 132 on the gate dielectric pattern 104 may be disposed on the substrate 100. The spacer 108 is disposed which may cover both sidewalls of the gate electrodes 122 and 132 and both sidewalls of the gate dielectric pattern 104. The source and drain regions 103 may be disposed in the substrate 100 on both sides of the gate electrodes 122 and 132.

The gate electrodes 122 and 132 may include the lower gate electrode 122, and the upper gate electrode 132 on the lower gate electrode 122. The lower gate electrode 122 and the upper gate electrode 132 may include different materials. For example, the lower gate electrode 122 may include a metal material for controlling the work function of the transistor, and the upper gate electrode 132 may be formed of a material having a lower resistivity than the lower gate electrode 122. The entire area of the lower surface of the upper gate electrode 132 may be the same as that of the upper surface of the lower gate electrode 122.

The interlayer dielectric 110 may be disposed on the substrate 100. The upper surface of the interlayer dielectric 110 and the upper surface of the upper gate electrode 132 may be coplanar.

According to the method of fabricating a semiconductor device according to an example embodiment of the inventive concepts, the opening 112 is completely filled by the first conductive layer 120. In another example embodiment, a conductive layer may be conformally formed in the opening 112. This will be described below with reference to the accompanying drawings.

A modification example of the method of fabricating semiconductor device according to an example embodiment of the inventive concepts will be described below. FIGS. 2A to 2D are cross-sectional views for describing a modification example of the method of fabricating semiconductor device according to an example embodiment of the inventive concepts.

Figure 2A:
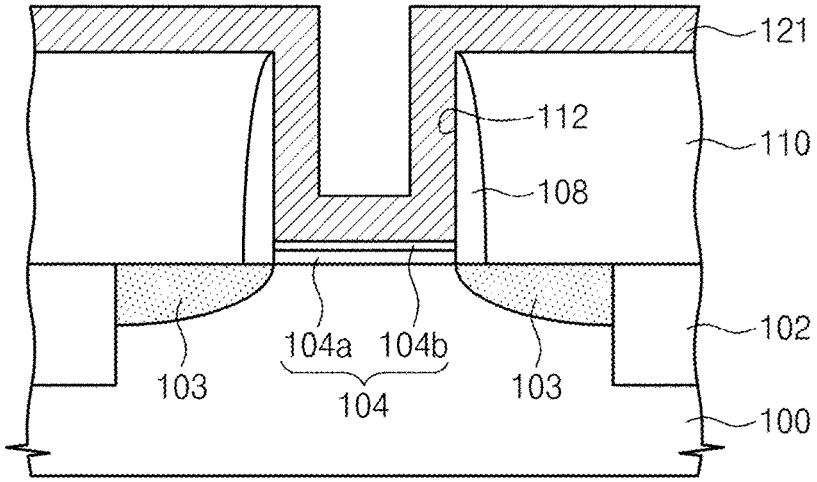
FIGS. 2A to 2D are cross-sectional views for describing a modification example of a method of fabricating semiconductor device according to an example embodiment of the inventive concepts.

Referring to FIG. 2A, like the method that has been described above with reference to FIGS. 1A and 1B, provided are the substrate 100, the device isolation pattern 102, the source and drain region 103, the gate dielectric pattern 104 including the insulation pattern 104a and the metal compound pattern 104b, the dummy gate pattern (not shown), the spacer 108, the interlayer dielectric 110 and the opening 112.

A first conductive layer 121 may be formed on the substrate 100 having the opening 112. The first conductive layer 121 may conformally cover the upper surface of the interlayer dielectric 110 and the bottom surface and sidewall of the opening 112. The thickness of the first conductive layer 121 may be less than one-half of the width of the opening 112. Therefore, the first conductive layer 121 may partially fill the opening 112. An empty internal space may be defined which is surrounded by the first conductive layer 121 formed in the opening 112.

A portion of the first conductive layer 121 in the opening 112 may be included in the gate of a transistor. The first conductive layer 121 may include a conductive material having a work function required by the transistor. The first conductive layer 121 may include the same material as that of the first conductive layer 120 that has been described above with reference to FIG. 1B.

Figure 2B:
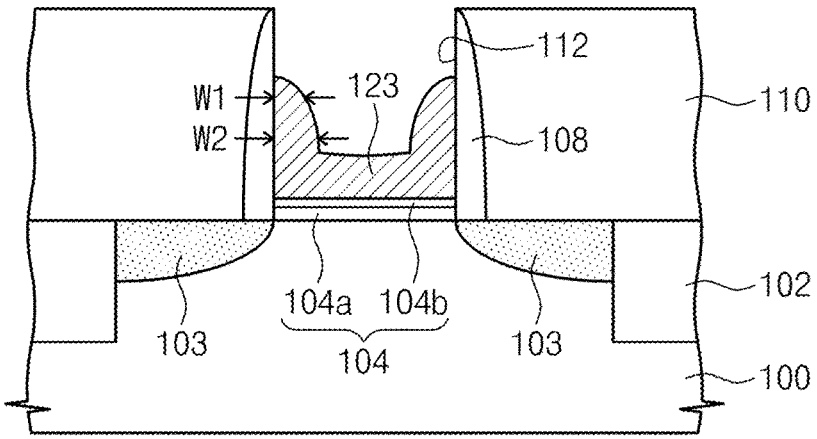

Referring to FIG. 2B, the first conductive layer 121 may be etched. The first conductive layer 121 may be etched in an inclined anisotropic etching process. The inclined anisotropic etching process may include a first sub-etching process and a second sub-etching process. The first sub-etching process may be performed while having a first inclination angle non-vertical and non-parallel to the upper surface of the substrate 100. The second sub-etching process may be performed while having a second inclination angle non-vertical and non-parallel to the upper surface of the substrate 100. The first and second inclination angles may be perpendicular. Therefore, the first conductive layer 121 formed on the interlayer dielectric 110 may be removed, and the first conductive layer 121 formed on upper portions of the sidewalls of the opening 112 may be removed. Consequently, a lower gate electrode 123 is formed which may cover the bottom surface of the opening 112 and lower portions of the sidewalls of the opening 112. The lower gate electrode 123 may be formed from the first conductive layer 121 remaining in the opening 112.

The lower gate electrode 123 may include a bottom portion covering the bottom surface of the opening 112, and sidewall portions covering the lower portions of the sidewalls of the opening 112. The bottom portion of the lower gate electrode 123 may completely cover the bottom surface of the opening 112. The sidewall portions of the lower gate electrode 123 may extend upward along the sidewalls of the opening 112 from both ends of the bottom portion of the lower gate electrode 123. The top surfaces of the sidewall portions of the lower gate electrode 123 may be lower than the top surface of the interlayer dielectric 110. The top surfaces of the sidewall portions of the lower gate electrode 123 may be higher than the top surface of the bottom portion of the lower gate electrode 123. The sidewall portion of the lower gate electrode 123 may cover the lower portions of the sidewalls of the opening 112, and the upper portions of the sidewalls of the opening 112 may be exposed. The width W1 of an upper portion of the sidewall portion of the lower gate electrode 123 may be narrower than the width W2 of a lower portion of the sidewall portions of the lower gate electrode 123.

Figure 2C:
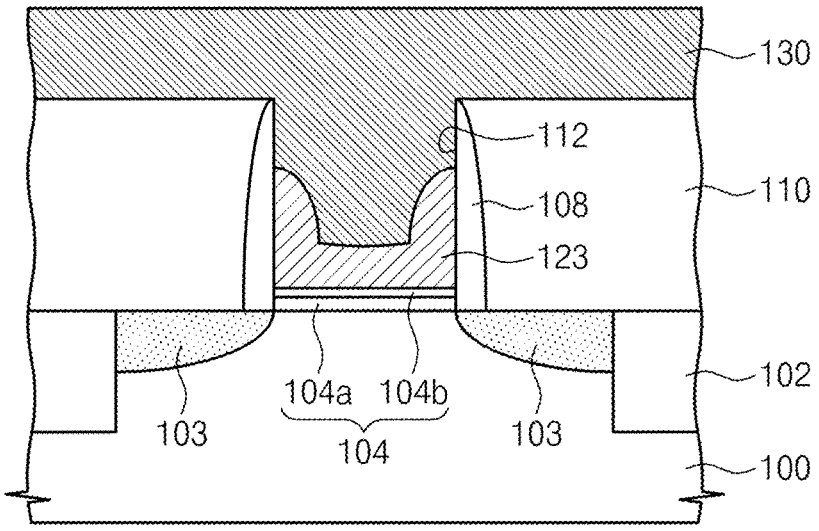

Referring to FIG. 2C, a second conductive layer 130 may be formed which fills the empty region of the opening 112. The second conductive layer 130 may fill an internal space that is surrounded by the sidewall portions of the lower gate electrode 123. The second conductive layer 130 may include the same material as that of the second conductive layer that has been described above with reference to FIG. 1D.

According to an example embodiment of the inventive concepts, the first conductive layer 121 may be etched before the second conductive layer 130 is formed. Therefore, the aspect ratio of the empty region of the opening 112 can decrease in which the second conductive layer 130 is formed. Accordingly, the second conductive layer 130 consistently fills the empty region of the opening 112.

When the first conductive layer 121 is not etched unlike example embodiments and the second conductive layer 130 fills the empty region of the opening 112, a void and a seam may be formed in the second conductive layer 130 formed in the opening 112 due to the high aspect ratio of the internal space. Accordingly, the reliability of a device can decrease.

However, according to an example embodiment of the inventive concepts, the first conductive layer 121 is etched before the second conductive layer 130 is formed, and the aspect ratio of the empty region of the opening 112 can be reduced. Accordingly, the second conductive layer 130 fills the empty region of the opening 112 without a void and seam.

Figure 2D:
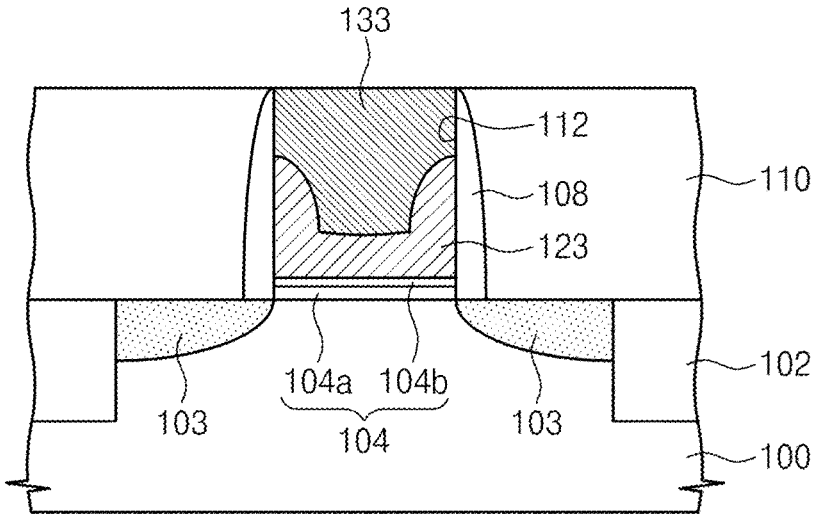

Referring to FIG. 2D, a planarization process for the second conductive layer 130 is performed using the upper surface of the interlayer dielectric 110 as an etch stop layer. Thus, the second conductive layer 130 formed on the upper surface of the interlayer dielectric 110 may be removed and an upper gate electrode 133 may be formed in the opening 112. The planarization process may be performed in an etch-back process or a CMP process. The upper gate electrode 133 may be the second conductive layer 130 remaining in the opening 112. The upper gate electrode 133 may fill a space that is surrounded by the sidewall portions of the lower gate electrode 123.

A semiconductor device that is formed through the method of fabricating a semiconductor device according to an example embodiment of the inventive concepts will be described below with reference to FIG. 2D.

Referring to FIG. 2D, the substrate 100 may include an active region that is defined by the device isolation pattern 102. The gate dielectric pattern 104 and the gate electrodes 123 and 133 that are sequentially stacked may be disposed on the substrate 100. The spacer 108 may be disposed on or covering both sidewalls of the gate electrodes 123 and 133 and both sidewalls of the gate dielectric pattern 104. The source and drain regions 103 may be disposed in the substrate 100 of both sides of the gate electrodes 123 and 133.

The gate electrodes 123 and 133 may include the lower gate electrode 123, and the upper gate electrode 133 on the lower gate electrode 123. The lower gate electrode 123 may include a bottom portion parallel to the substrate 100, and sidewall portions that extend in a vertical direction to the substrate 100 from both ends of the bottom portion. The upper gate electrode 133 may be disposed on the lower gate electrode 123. The upper gate electrode 133 may fill a space that is surrounded by the sidewall portions of the lower gate electrode 123. The entire area of the lower surface of the upper gate electrode 133 may be the same as that of the upper surface of the lower gate electrode 123.

The lower gate electrode 123 and the upper gate electrode 133 may include different materials. For example, the lower gate electrode 123 may include a metal material for controlling the work function of a transistor, and the upper gate electrode 133 may include a material having a lower resistivity than the lower gate electrode 123.

The interlayer dielectric 110 may be disposed on the substrate 100. The upper surface of the interlayer dielectric 110 and the upper surface of the upper gate electrode 133 may be coplanar.

According to the method of fabricating a semiconductor device according to an example embodiment of the inventive concepts and its modification example, the dummy gate pattern 106 is removed, and thereby the opening 112 is formed. In another example embodiment, the gate dielectric pattern 104 and the dummy gate pattern 106 may be removed, and thus the opening 112 may be defined. This will be described below with reference to the accompanying drawings.

Figure 3A:
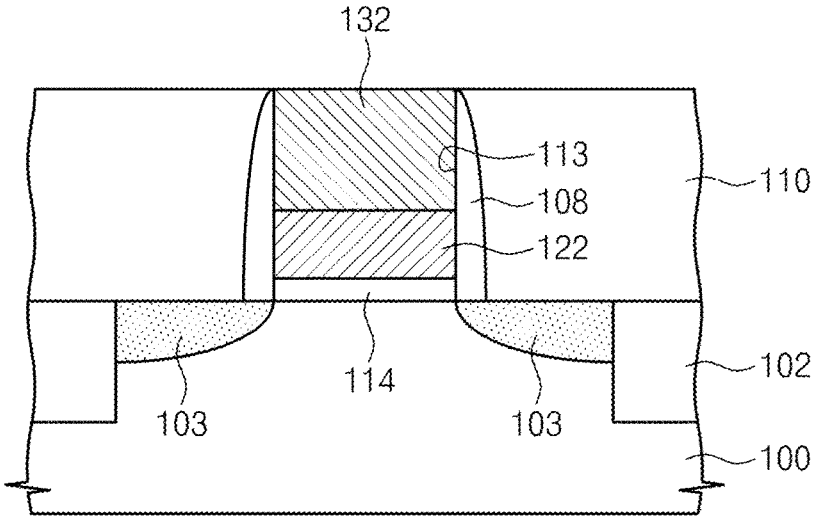
FIGS. 3A to 3B are cross-sectional views for describing other modification examples of the method of fabricating semiconductor device according to an example embodiment of the inventive concepts.
Figure 3B:
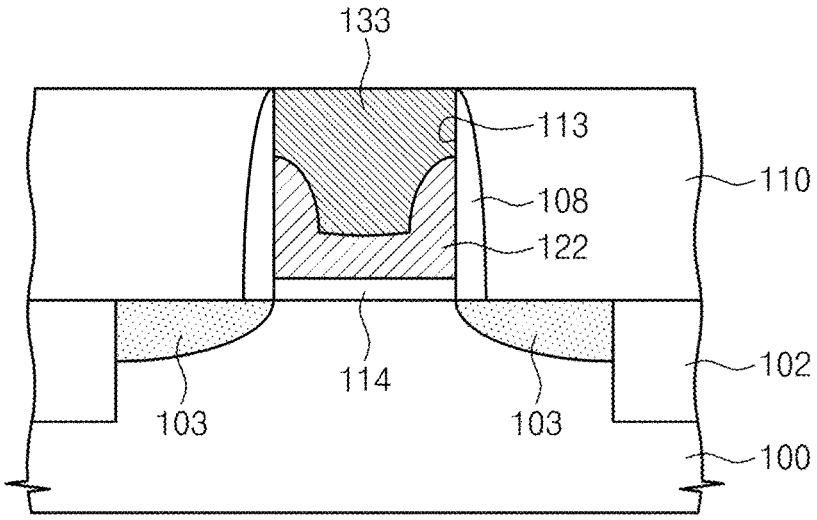

Other modification examples of the method of fabricating a semiconductor device according to an example embodiment of the inventive concepts will be described below. FIGS. 3A to 3B are cross-sectional views for describing other modification examples of the method of fabricating a semiconductor device according to an example embodiment of the inventive concepts.

Referring to FIGS. 3A and 3B, like the method that has been described above with reference to FIGS. 1A and 1B, provided may be the substrate 100, the device isolation pattern 102, the source and drain region 103, the gate dielectric pattern (not shown), the dummy gate pattern 106, the spacer 108, and the interlayer dielectric 110.

The dummy gate pattern 106 and the gate dielectric pattern (not shown) may be removed. Removing the dummy gate pattern 106 and the gate dielectric pattern (not shown) may include etching the dummy gate pattern 106 and the gate dielectric pattern 104 by using the upper surface of the substrate 100 as an etch stop layer. The dummy gate pattern 106 and the gate dielectric pattern are removed, and thus, an opening 113 may be formed for exposing the upper surface of the substrate 100. The bottom surface of the opening 113 may be composed of the upper surface (i.e., the upper surface of a portion of an active region) of the substrate 100, and the sidewalls of the opening 113 may be composed of the sidewalls of the spacer 108.

The opening 113 is formed, and a gate dielectric pattern 114 on or covering the exposed upper surface of the substrate 100 may be formed. The gate dielectric pattern 114 may completely cover the exposed upper surface of the substrate 100. The gate dielectric pattern 114 may be formed as a thermal oxide layer. In another example embodiment, when the gate dielectric pattern 114 is formed in a deposition process, the gate dielectric pattern 114 may be formed on the sidewall of the opening 113 unlike in the example embodiment as illustrated in FIG. 2. In this case, the gate dielectric pattern 114 may include the same material as that of the gate dielectric pattern 104 that has been described above with reference to FIG. 1A.

Subsequently, as illustrated in FIG. 3A, the lower gate electrode 122 may be formed from the first conductive layer 120 as described with reference to FIG. 1B. In this case, the method of fabricating a semiconductor device that has been described above with reference to FIGS. 1C and 1D may be performed.

In another example embodiment as illustrated in FIG. 3B, the lower gate electrode 122 may be formed from the first conductive layer 121 that has been described with reference to FIG. 1A. In this case, the method of fabricating a semiconductor device that has been described above with reference to FIGS. 2B to 2D may be performed.

A method of fabricating semiconductor device according to another example embodiment of the inventive concepts will be described below. FIGS. 4A to 4G are cross-sectional views for describing a method of fabricating a semiconductor device according to another example embodiment of the inventive concepts.

Figure 4A:
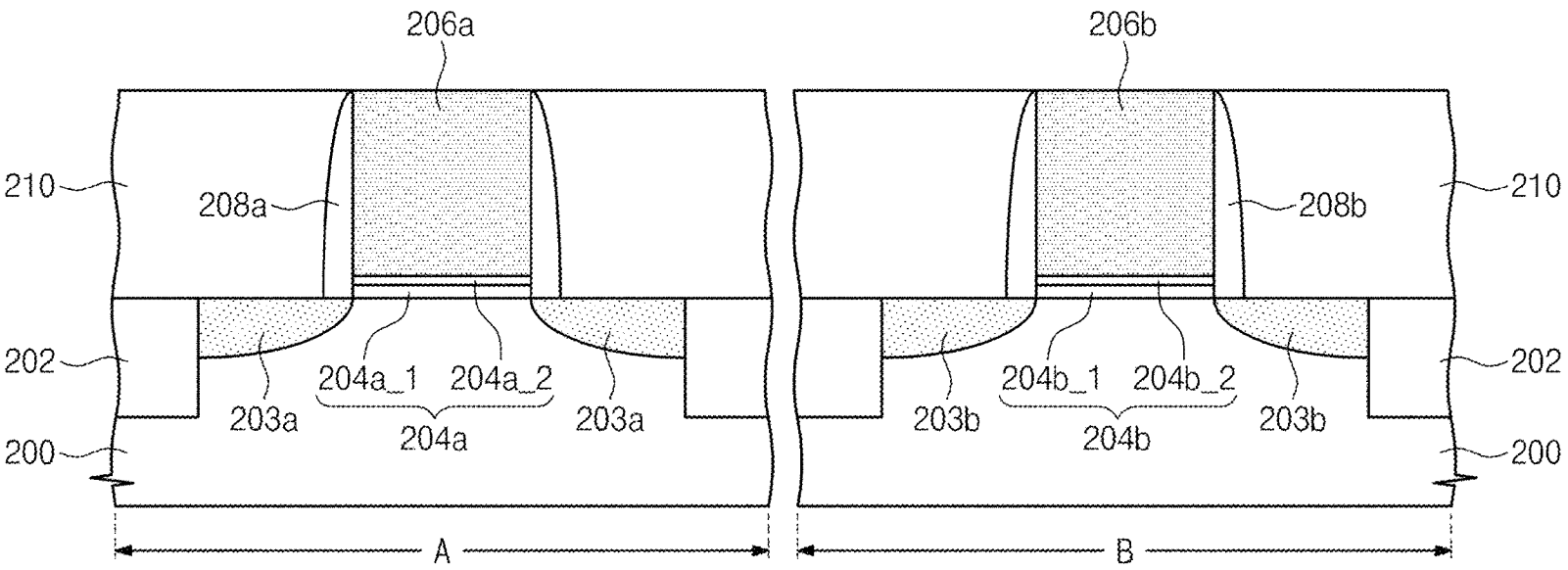
FIGS. 4A to 4G are cross-sectional views for describing a method of fabricating semiconductor device according to another example embodiment of the inventive concepts.

Referring to FIG. 4A, a substrate 200 is provided. For example, the substrate 200 may be a silicon substrate, a germanium substrate, a silicon-germanium substrate, or a compound semiconductor substrate.

The substrate 200 may include a first region A and a second region B. The substrate 200 of the first region A may be doped with a first conductive dopant. The substrate 200 of the second region B may be doped with a second conductive dopant. One of the first and second regions A and B may be a PMOS region where a PMOS transistor is formed, and the other may be an NMOS region where an NMOS transistor is formed.

First and second active regions may be defined by forming a device isolation pattern 202 on the substrate 200 including the first and second regions A and B, respectively. The first and second active regions may be a portion of the substrate 200 of the first region A and a portion of the substrate 200 of the second region B that are surrounded by the device isolation pattern 202, respectively. The device isolation pattern 202 may be formed by forming a trench on the substrate 200 and filling the trench with an insulating material.

First and second gate dielectric patterns 204a and 204b may be formed on the substrate 200 of the first and second region A, B, respectively. The first and second gate dielectric patterns 204a and 204b may include at least one selected from among a silicon oxynitride layer, a silicon nitride layer, a silicon oxide layer, or a metal oxide layer. The first and second gate dielectric patterns 204a and 204b may have multi layers. For example, the first and second gate dielectric patterns 204a and 204b may include insulation patterns 204a_1 and 204b_1, and metal compound patterns 204a_2 and 204b_2 on the insulation patterns 204a_1 and 204b_1, respectively. The insulation patterns 204a_1 and 204b_1 may include any one of a silicon oxide layer, a silicon nitride layer, or a silicon oxynitride layer. The metal compound patterns 204a_2 and 204b_2 may include any one of a metal oxide layer, a metal silicide layer, a metal nitride layer, or a metal oxynitride layer. The first and second gate dielectric patterns 204a and 204b may be formed of the same material.

First and second dummy gate patterns 206a and 206b may be formed on the first and second gate dielectric patterns 204a and 204b, respectively. The first and second dummy gate patterns 206a and 206b and the first and second gate dielectric patterns 204a and 204b may be formed of a material having an etch selectivity. For example, the first and second dummy gate patterns 206a and 206b may be formed of silicon.

A first spacer 208a on or covering the sidewall of the first gate dielectric pattern 204a and the sidewall of the first dummy gate patterns 206a may be formed. A second spacer 208b on or covering the sidewall of the second gate dielectric pattern 204b and the sidewall of the second dummy gate patterns 206b may be formed. The first and second spacers 208a and 208b may be formed simultaneously. For example, forming the first and second spacers 208a and 208b may include forming a spacer layer on the substrate 200 of the first and second regions A and B, and etching the spacer layer in an anisotropic etching process. The spacer layer may include an insulating material.

A first source and drain region 203a may be formed in a first active region of the substrate 200 on both sides of the first dummy gate pattern 206a and first gate dielectric pattern 204a. The first source and drain region 203a may be a region that is doped with a second conductive dopant. For example, when the first region A is an NMOS region, the substrate 200 of the first region A may be doped with a P-type dopant, and the first source and drain 203a may be doped with an N-type dopant.

A second source and drain region 203b may be formed in a second active region of the substrate 200 on both sides of the second dummy gate pattern 206b and second gate dielectric pattern 204b. The second source and drain region 203b may be a region that is doped with a first conductive dopant. For example, when the second region B is a PMOS region, the substrate 200 of the second region B may be doped with an N-type dopant, and the second source and drain 203b may be doped with a P-type dopant.

An interlayer dielectric (not shown) may be formed on the substrate 200 of the first and second regions A and B. After forming the interlayer dielectric, a planarization process may be performed for the interlayer dielectric by using the upper surface of the first and second dummy gate patterns 206a and 206b as an etch stop layer. The upper surface of the planarized interlayer dielectric 210 and the upper surface of the first and second dummy gate patterns 206a and 206b may be coplanar. The planarization process may be performed in an etch-back process or a Chemical Mechanical Polishing (CMP) process. The upper surface of the first and second dummy gate patterns 206a and 206b may be exposed by the planarization process.

Figure 4B:
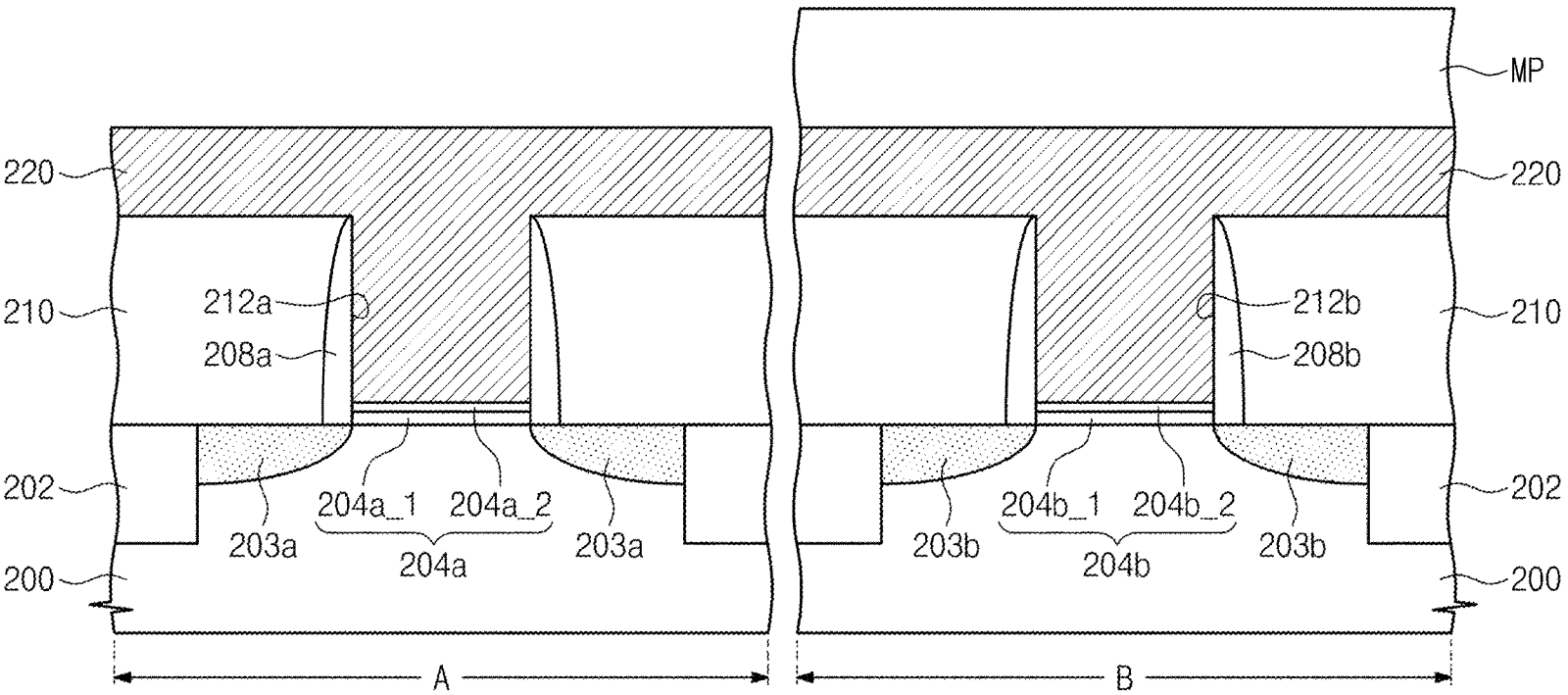

Referring to FIG. 4B, the exposed first and second dummy gate patterns 206a and 206b may be removed, and then the first and second dummy gate patterns 206a and 206b may be completely removed. Removing the first and second dummy gate patterns 206a and 206b may include etching the first and second dummy gate patterns 206a and 206b by using the metal compound patterns 204a_2 and 204b_2 of the first and second gate dielectric patterns 204a and 204b as an etch stop layer, respectively. The first and second dummy gate patterns 206a and 206b are removed, and thus first and second openings 212a and 212b may be formed on the first and second regions A and B, respectively.

The first and second openings 212a and 212b may expose the first and second gate dielectric patterns 204a and 204b, respectively. The bottom surfaces of the first and second openings 212a and 212b may respectively be composed of the upper surfaces of the first and second gate dielectric patterns 204a and 204b, and the sidewalls of the first and second openings 212a and 212b may respectively be composed of the sidewalls of first and second spacers 208a and 208b.

A first conductive layer 220 may be formed on the substrate 200 of the first and second regions A and B. The first conductive layer 220 may cover the upper surface of the interlayer dielectric 210. The first conductive layer 220 may completely fill the first and second openings 212a and 212b.

A portion of the first conductive layer 220 in the second opening 212b may be included in the gate of a transistor on the second region B. The first conductive layer 220 may include a conductive material having a work function required by the transistor of the second region B. For example, when an NMOS transistor is formed in the second region B, the first conductive layer 220 may include a metal-containing material having a work function that is relatively close to the lower-end edge of the conductive band of a semiconductor (for example, silicon) from among the lower-end edge of the conductive band and the upper-end edge of the valence band of the semiconductor. The semiconductor may constitute the substrate 200 of the second region B. In another example embodiment, when a PMOS transistor is formed in the second region B, the first conductive layer 220 may include a metal-containing material having a work function that is relatively close to the upper-end edge of the valence band of the semiconductor from among the lower-end edge of the conductive band and the upper-end edge of the valence band.

The first conductive layer 220 may include a metal-containing layer. For example, the first conductive layer 220 may include any one of a titanium nitride layer, a titanium silicide layer, a titanium aluminum nitride layer, a tantalum nitride layer, a titanium tantalum nitride layer, a tantalum aluminum nitride layer, or a tantalum silicide nitride layer. For example, the first conductive layer 220 is a titanium silicide layer when the transistor is an NMOS transistor, but the first conductive layer 220 is a titanium silicide nitride layer when the transistor is a PMOS transistor.

The work function of the first conductive layer 220 may be controlled according to a composition ratio of materials constituting the first conductive layer 220. For example, when the first conductive layer 220 is formed as a titanium nitride layer, the titanium concentration of a case where the transistor is an NMOS transistor is higher than that of a case where the transistor is a PMOS transistor, and the nitrogen concentration of a case where the transistor is an NMOS transistor is lower than that of a case where the transistor is a PMOS transistor.

A mask pattern MP is formed which may cover the first conductive layer 220 on the second region B. The mask pattern MP may completely cover the first conductive layer 220 that is disposed on the second opening 212b. The mask pattern MP may include a material having an etch selectivity respect to the first conductive layer 220.

Figure 4C:
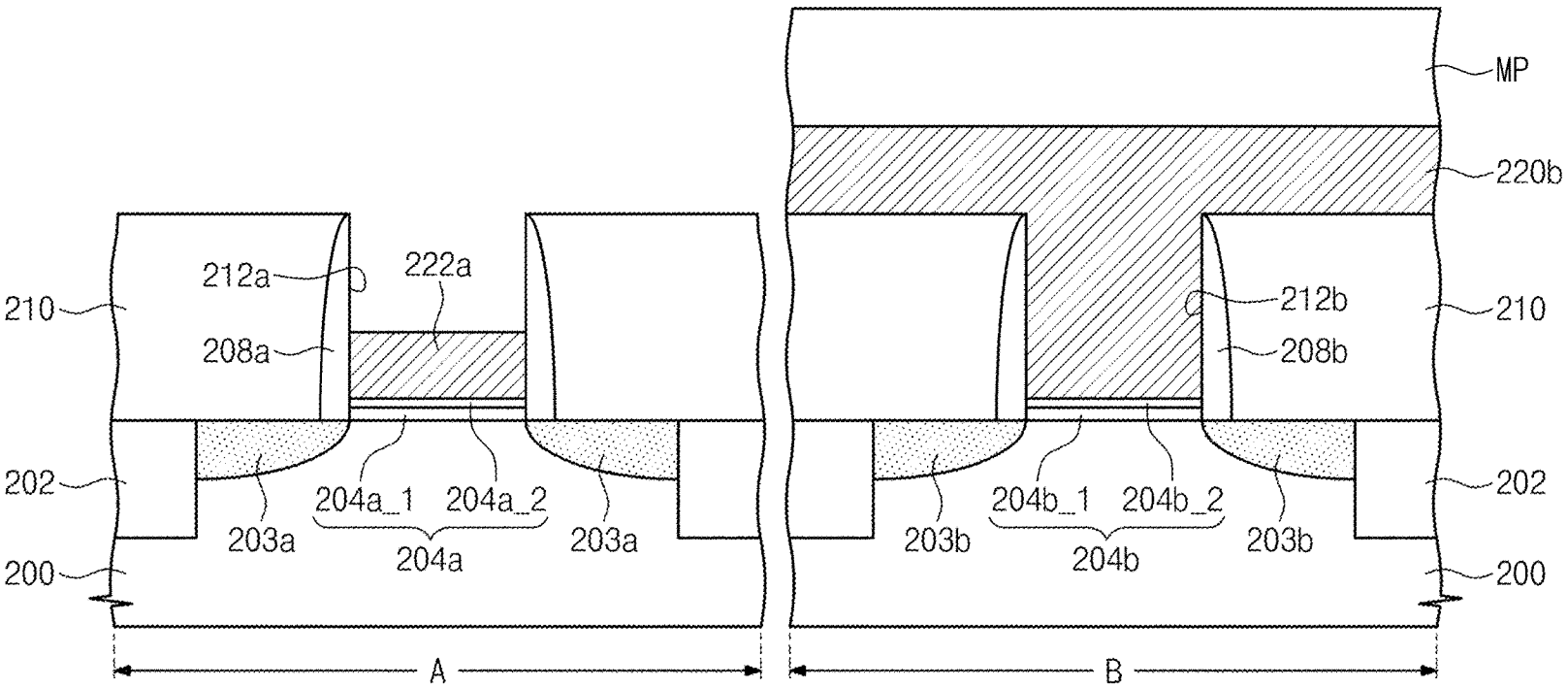

Referring to FIG. 4C, a first etching process of etching the first conductive layer 220 on the first region A may be performed by using the mask pattern MP as an etch mask. The first etching process may include a wet etching process and/or a dry etching process. Through the first etching process, the first conductive layer 220 may be removed which is formed on the interlayer dielectric 220 of the first region A, the first conductive layer 220 may be removed which is disposed in an upper region of the first opening 212a, and a portion of the first conductive layer 220 may remain in a lower region of the first opening 212a. Accordingly, a recessed first conductive layer 222a may be formed which fills the lower region of the first opening 212a.

The upper surface of the recessed first conductive layer 222a may be lower than the upper surface of the interlayer dielectric 210. Therefore, an upper portion of the sidewall of the first opening 212a may be exposed. The bottom surface of the first opening 212a and a lower portion of the sidewall of the first opening 212a may cover the recessed first conductive layer 222a. The lower region of the first opening 212a may be filled with the recessed first conductive layer 222a, and the upper region of the first opening 212a may be empty.

The first conductive layer 220, which may be covered by the mask pattern MP and is disposed in the second region B, is not etched, and thus, a patterned first conductive layer 220b may be formed.

Figure 4D:
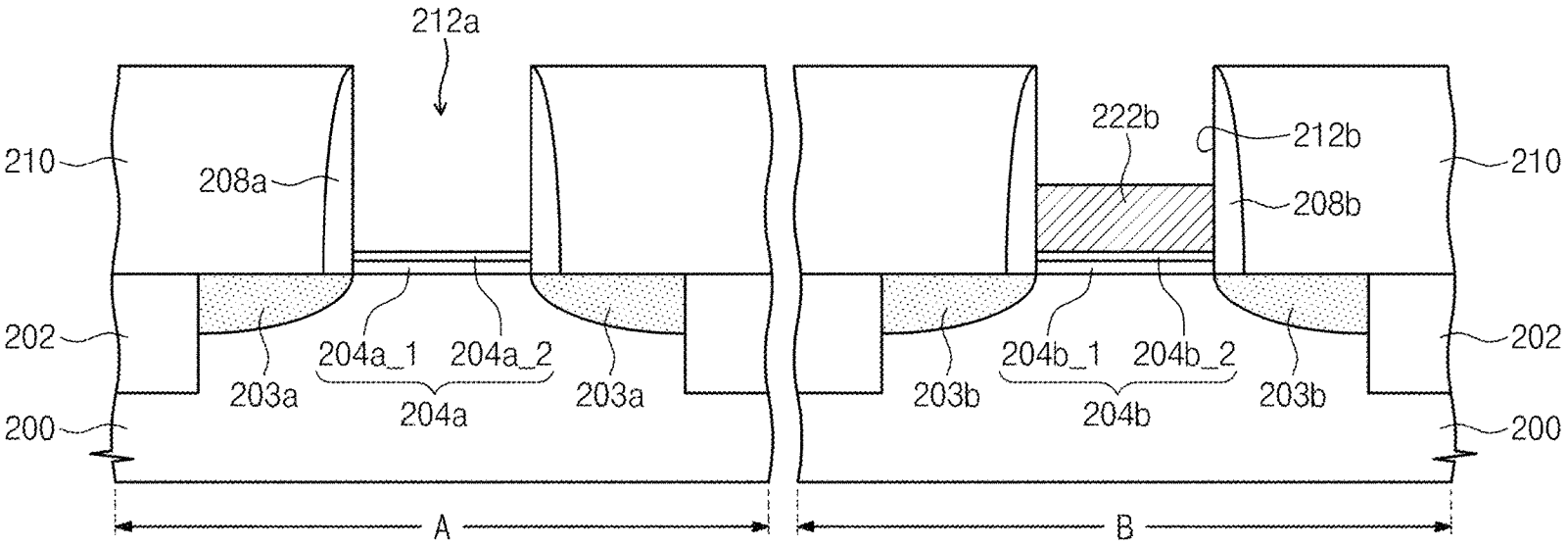

Referring to FIG. 4D, the mask pattern MP may be removed after the first etching process. The mask pattern MP may be removed, and thus the upper surface of the patterned first conductive layer 220b may be exposed.

The mask pattern MP may be removed, and then a second etching process of etching the recessed first conductive layer 222a and the patterned first conductive layer 220b may be performed. The second etching process may include a wet etching process and/or a dry etching process. Through the second etching process, the recessed first conductive layer 222a in the first opening 212a is completely removed, and thus the bottom surface of the first opening 212a may be exposed. Through the second etching process, the patterned first conductive layer 220b may be removed which is disposed on the interlayer dielectric 210 of the second region B, the patterned first conductive layer 220b may be removed which is disposed in an upper region of the second opening 212b, and a portion of the patterned first conductive layer 220b may form the second region lower gate electrode 222b filling the lower region of the second opening 212b.

The upper surface of the second region lower gate electrode 222b may be lower than the upper surface of the interlayer dielectric 210. Consequently, an upper portion of the sidewall of the second opening 212b may be exposed. The bottom surface of the second opening 212b and a lower portion of the sidewall of the second opening 212b may be covered by the second region lower gate electrode 222b. The lower region of the second opening 212b may be filled with the second region lower gate electrode 222b, and the upper region of the second opening 212b may be empty.

Figure 4E:
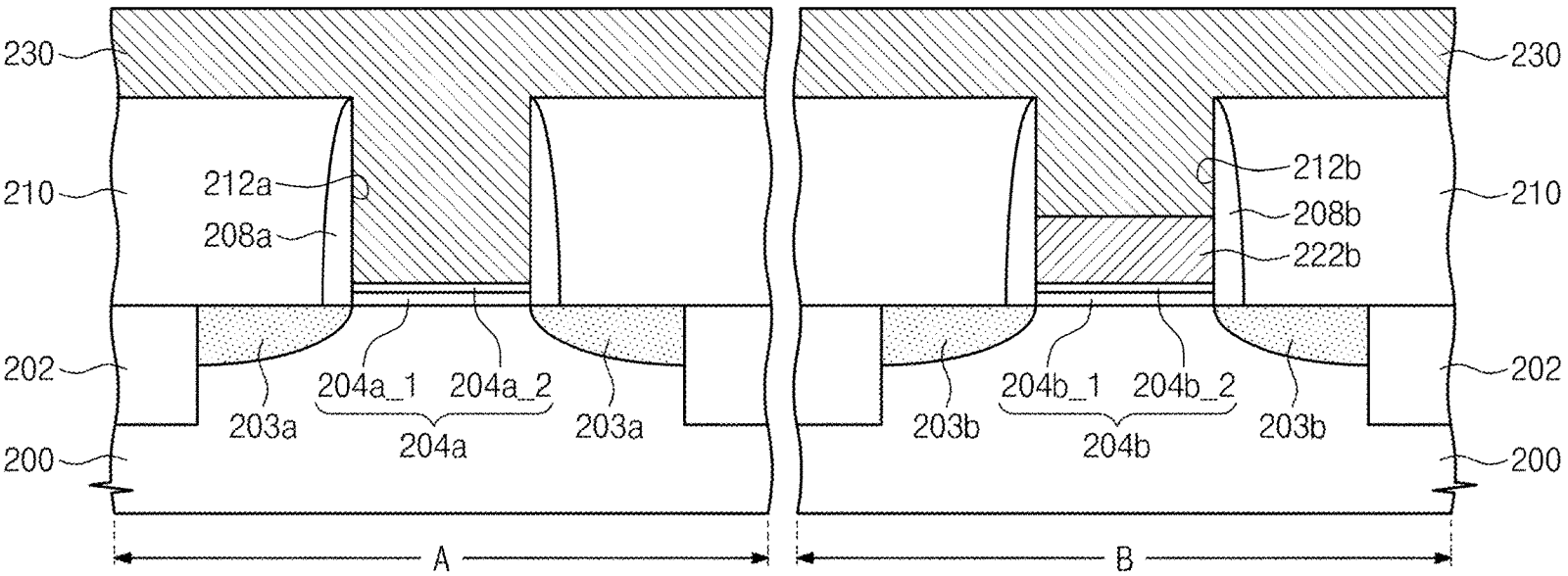

Referring to FIG. 4E, after the second etching process is performed, a second conductive layer 230 may be formed which fills the empty first opening 212a and the upper region of the second opening 212b. The second conductive layer 230 may be formed on the interlayer dielectric 210 in the first and second regions A and B. The thickness of the second conductive layer 230 may be equal to or greater than one-half of the widths of the first and second openings 212a and 212b. Therefore, the second conductive layer 230 may completely fill the first and second openings 212a and 212b. The second conductive layer 230 may include a conductive material having a work function required by a transistor to be formed in the first region A. The work function of the second conductive layer 230 may differ from that of the first conductive layer 220.

Figure 4F:
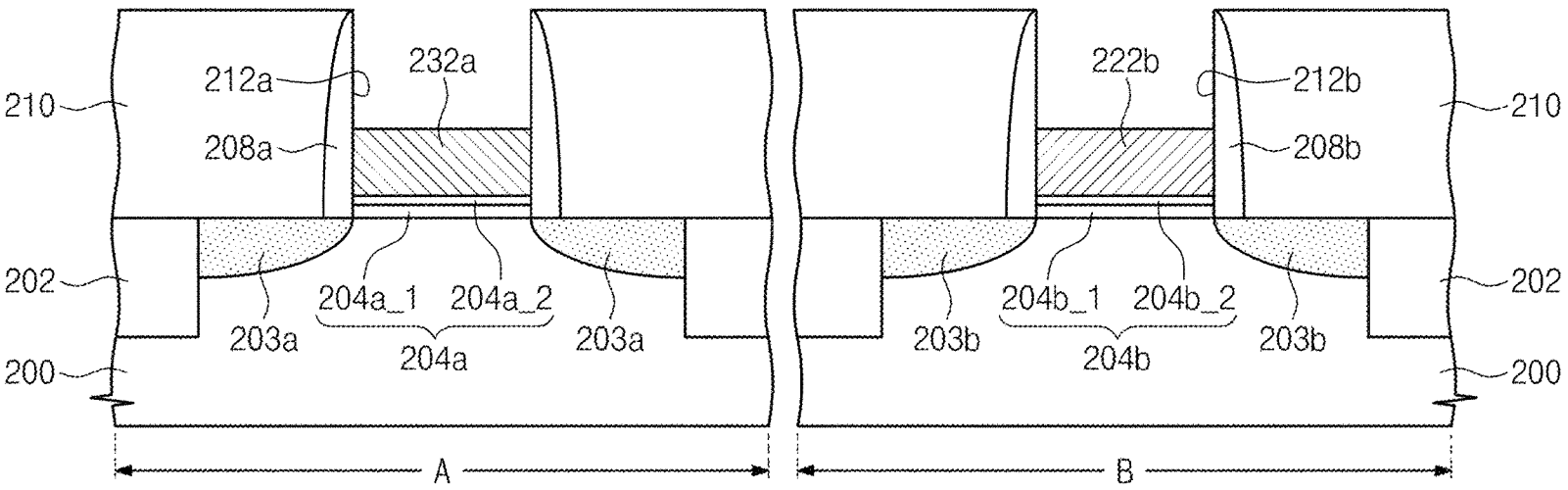

Referring to FIG. 4F, the second conductive layer 230 may be etched. The second conductive layer 230 may be etched in a wet etching process and/or a dry etching process. The second conductive layer 230 may be removed which is formed on the interlayer dielectric 210 of the first and second regions A and B, the second conductive layer 230 may be removed which is formed in the second opening 212b, the first conductive layer 220 may be removed which is disposed in an upper region of the first opening 212a, a portion of the second conductive layer 230 may remain in a lower region of the first opening 212a, and the second region lower gate electrode 222b may remain in the second opening 212b. Therefore, a first region lower gate electrode 232a may be formed which fills the lower region of the first opening 212a.

The upper surface of the first region lower gate electrode 232a may be lower than the upper surface of the interlayer dielectric 210. Therefore, an upper portion of the sidewall of the first opening 212a may be exposed. The bottom surface of the first opening 212a and a lower portion of the sidewall of the first opening 212a may be covered by the first region lower gate electrode 232a. The lower region of the first opening 212a may be filled with the first region lower gate electrode 232a, and the upper region of the first opening 212a may be empty.

According to a modification example (not shown) of another example embodiment of the inventive concepts, the second conductive layer 230 is formed, and then by performing a planarization process for the second conductive layer 230 using the upper surface of the interlayer dielectric 210 as an etch stop layer, gate electrodes may be formed which fill the first and second openings 212a and 212b, respectively.

Figure 4G:
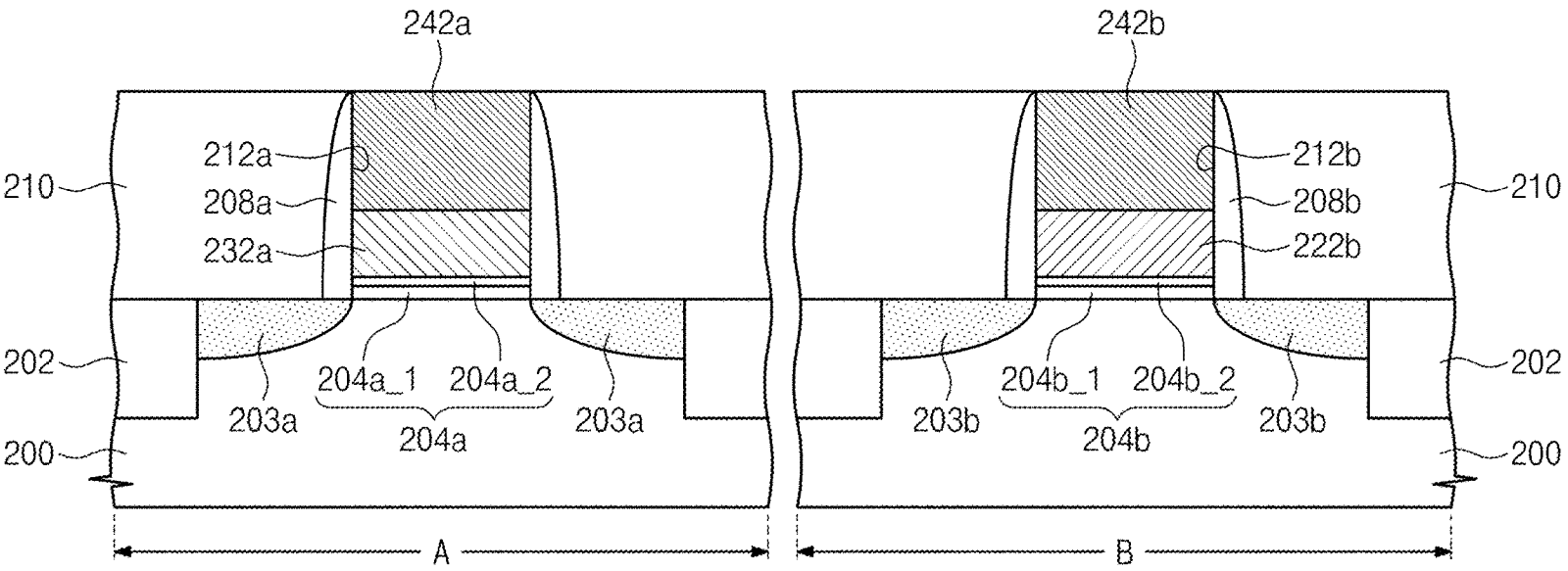

Referring to FIG. 4G, first and second region upper gate electrodes 242a and 242b may be formed which fill the empty upper region of the first opening 212a and the empty upper region of the second opening 212b, respectively. Forming the first and second region upper gate electrodes 242a and 242b may include forming a third conductive layer (not shown) on the substrate 200 of the first and second regions A and B and performing a planarization process for the third conductive layer by using the upper surface of the interlayer dielectric 210 as an etch stop layer after forming the first region lower gate electrode 232a. Therefore, the third conductive layer is removed which is formed on the interlayer dielectric 210, the third conductive layer remains which is formed in the first and second openings 212a and 212b, and thus the first and second region upper gate electrodes 242a and 242b may be formed. Planarizing the third conductive layer may be performed in an etch-back process or a CMP process.

The third conductive layer may include a material having a lower resistivity than the first and second conductive layers 220 and 230. For example, the third conductive layer may include any one of aluminum, aluminum alloy, tungsten, or copper.

The entire area of the lower surface of the first region upper gate electrode 242a may be the same as that of the upper surface of the first region lower gate electrode 232a. The entire area of the lower surface of the second region upper gate electrode 242b may be the same as that of the upper surface of the second region lower gate electrode 232b.

According to an example embodiment of the inventive concepts, the first and second region lower gate electrodes 232a and 222b may be formed to have a work function required by transistors to be formed in the first and second regions A and B, respectively. The first and second region upper gate electrodes 242a and 242b may be formed of a material having a lower resistivity. Therefore, the gate electrodes according to an example embodiment of the inventive concepts minimize or reduce a resistance and have a work function required by transistors to be formed in each region, and thus, a semiconductor device having an improved operating speed may be implemented.

Hereinafter, a semiconductor device formed by the method of fabricating a semiconductor device according to another example embodiment of the inventive concepts will be described with reference to FIG. 4G.

Referring to FIG. 4G, the substrate 200 including the first and second regions A and B may include first and second active regions that are defined by the device isolation pattern 202. The first and second gate dielectric patterns 204a and 204b may be respectively disposed on the first and second regions A and B. The first and second region lower gate electrodes 232a and 222b may be disposed on the first and second gate dielectric patterns 204a and 204b, respectively. The first and second region upper gate electrodes 242a and 242b may be disposed on the first and second region lower gate electrodes 232a and 222b, respectively. First and second spacers 208a and 208b are disposed which may cover both sidewalls of the first region gate electrodes 232a and 242a and both side walls of the second region gate electrodes 222b and 242b, respectively. First and second source and drain regions 203a and 203b may be disposed in the substrate 200 on both sides of the first region gate electrodes 232a and 242a and or both side walls of the second region gate electrodes 222b and 242b.

The first region gate electrodes 232a and 242a may include the first region lower gate electrode 232a, and the first region upper gate electrode 242a on the first region lower gate electrode 232a. The first region lower gate electrode 232a and the first region upper gate electrode 242a may include different materials. For example, the first region lower gate electrode 232a may include a metal material for satisfying a work function required by a transistor that is formed on the first region A, and the first region upper gate electrode 242a may be formed of a material having a lower resistivity than the first region lower gate electrode 232a. The entire area of the lower surface of the first region upper gate electrode 242a may be the same as that of the upper surface of the first region lower gate electrode 232a.

The second region gate electrodes 222b and 242b may include the second region lower gate electrode 222b, and the second region upper gate electrode 242b on the second region lower gate electrode 222b. The second region lower gate electrode 222b and the second region upper gate electrode 242b may include different materials. For example, the second region lower gate electrode 222b may include a metal material for satisfying a work function required by a transistor that is formed on the first region A, and the second region upper gate electrode 242b may be formed of a material having a lower resistivity than the second region lower gate electrode 222b. The entire area of the lower surface of the second region upper gate electrode 242b may be the same as that of the upper surface of the second region lower gate electrode 222b.

The interlayer dielectric 210 may be disposed on the substrate 200 of the first and second regions A and B. The upper surface of the interlayer dielectric 210 and the upper surfaces of the first and second region upper gate electrodes 242a and 242b may be coplanar.

According to the method of fabricating a semiconductor device according to another example embodiment of the inventive concepts, the first and second openings 212a and 212b are completely filled by the first and second conductive layers 220 and 230. In another example embodiment, conductive layers may be conformally formed in the first and second openings 212a and 212b. This will be described below with reference to the accompanying drawings.

A modification example of the method of fabricating a semiconductor device according to another example embodiment of the inventive concepts will be described below. FIGS. 5A to 5F are cross-sectional views for describing a modification example of the method of fabricating semiconductor device according to another example embodiment of the inventive concepts.

Figure 5A:
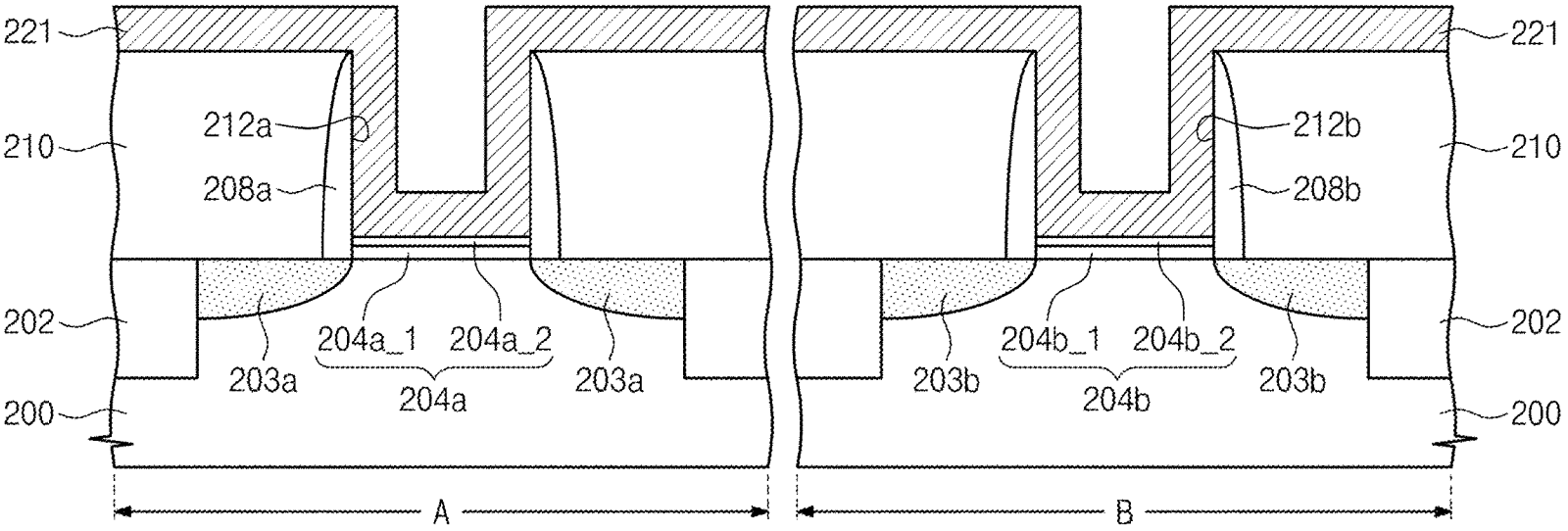
FIGS. 5A to 5F are cross-sectional views for describing a modification example of the method of fabricating semiconductor device according to another example embodiment of the inventive concepts.

Referring to FIG. 5A, like the method that has been described above with reference to FIGS. 1A and 1D, provided may be the substrate 200 including the first and second regions A and B, the interlayer dielectric 210 and the first and second openings 212a and 212b.

A first conductive layer 221 may be formed on the substrate 200. The first conductive layer 221 may conformally cover the upper surface of the interlayer dielectric 210 of the first and second regions A and B and the bottom surfaces and sidewalls of the first and second openings 212a and 212b. The thickness of the first conductive layer 221 may be less than one-half of the widths of the first and second openings 212a and 212b. Therefore, the first conductive layer 221 may partially fill the first and second openings 212a and 212b. Empty internal spaces in the first and second openings 212a, and 212b may be defined which is surrounded by the first conductive layer 221 formed on the sidewalls of the first and second openings 212a and 212b.

The first conductive layer 221 may include a metal material having a work function required by a transistor to be formed on the second region B. The first conductive layer 221 may include the same material as that of the first conductive layer 220 that has been described above with reference to FIG. 3B.

Figure 5B:
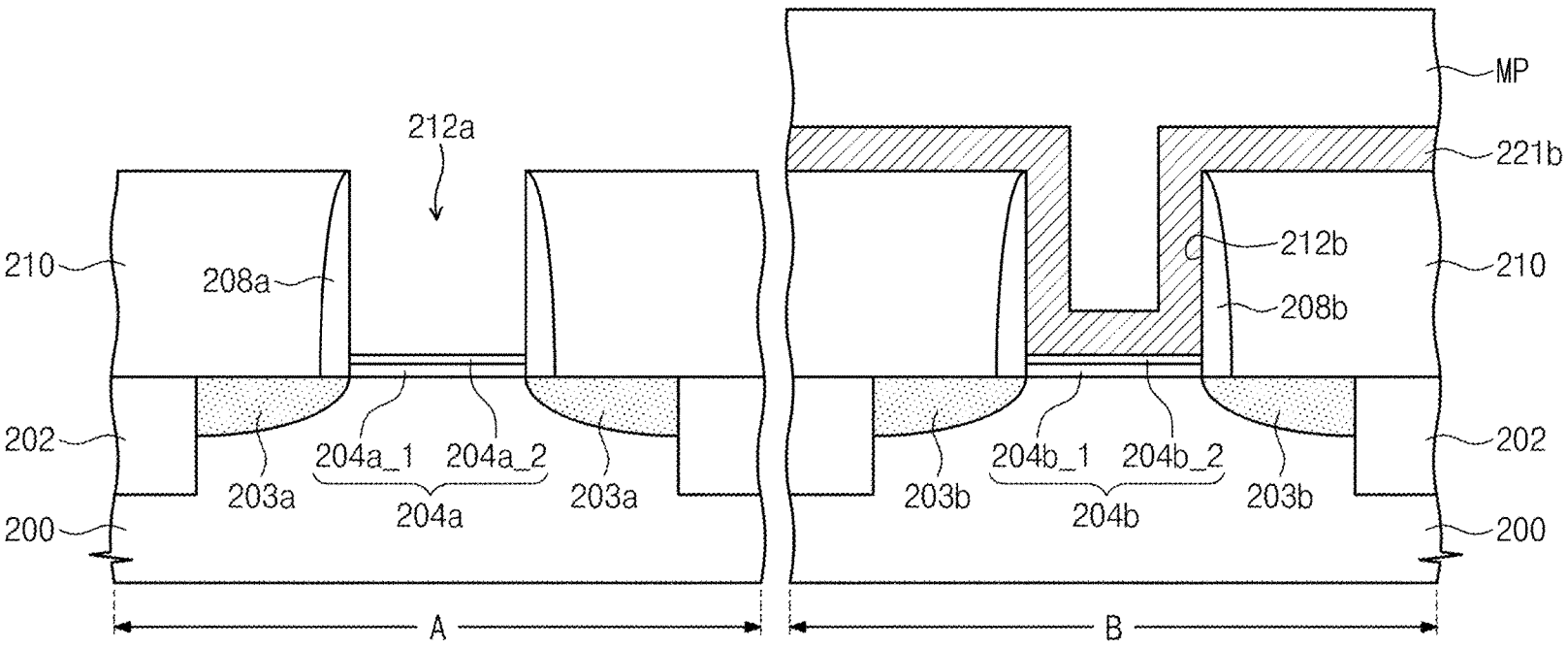

Referring to FIG. 5B, a mask pattern MP is formed which may cover the first conductive layer 221 formed on the second region B. The mask pattern MP may include a material having an etch selectivity with respect to the first conductive layer 221.

The first conductive layer 221 may be etched using the mask pattern MP as an etch mask. Therefore, the first conductive layer 221 is completely removed which is disposed on the first region A, and thus the bottom surface and sidewalls of the first opening 212a may be exposed. The first conductive layer 221 remains which is disposed on the second region B, and thus, a patterned first conductive layer 221b may be formed.

Figure 5C:
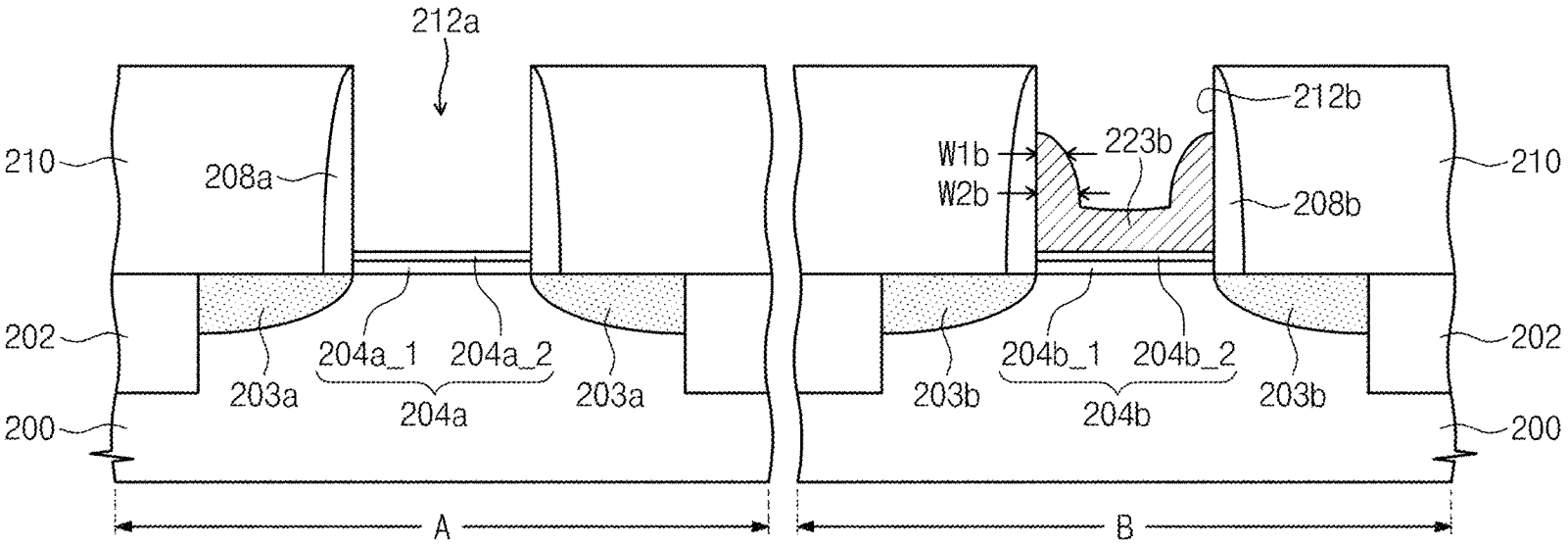

Referring to FIG. 5C, the patterned first conductive layer 221b is etched, and thus a second region lower gate electrode 223b may be formed. Etching the patterned first conductive layer 221b may be performed by an inclined anisotropic etching process as described in FIG. 2B. Therefore, the patterned first conductive layer 221b may be removed which is disposed on the interlayer dielectric 210 of the second region B, the patterned first conductive layer 221b may be removed which is formed on an upper portion of the sidewalls of the second opening 212b, and the patterned first conductive layer 221b may remain which is formed on a lower portion of the sidewalls of the second opening 232b and the bottom surface of the second opening 212b. Accordingly, the second region lower gate electrode 223b may be formed which fills a lower region of the second opening 212b.

The second region lower gate electrode 223b may include a bottom portion covering the bottom surface of the second opening 212b, and sidewall portions covering the lower portions of the sidewalls of the second opening 212b. The bottom portion of the second region lower gate electrode 223b may completely cover the bottom surface of the second opening 212b. The sidewall portions of the second region lower gate electrode 223b may be extended along the sidewalls of the second opening 212b from both ends of the bottom portion of the second region lower gate electrode 223b. The upper surfaces of the sidewall portions of the second region lower gate electrode 223b may be lower than the upper surface of the interlayer dielectric 210. Therefore, the sidewall portions of the second region lower gate electrode 223b may cover the lower portion of the sidewalls of the second opening 212b, and the upper portion of the sidewalls of the second opening 212b may be exposed. The width W1b of upper portions of the sidewall portions of the second region lower gate electrode 223b may be narrower than the width W2b of lower portions of the sidewall portions of the second region lower gate electrode 223b. The upper surfaces of the sidewall portions of the second region lower gate electrode 223b may be higher than the upper surface of the bottom portion of the second region lower gate electrode 223b.

Figure 5D:
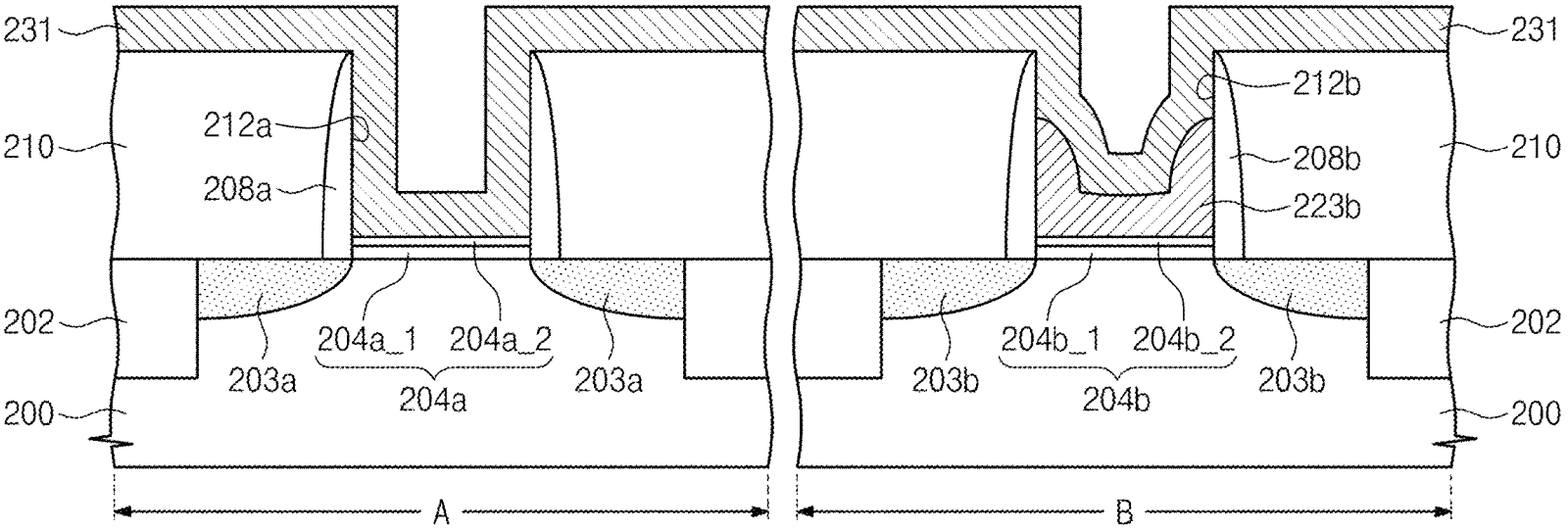

Referring to FIG. 5D, a second conductive layer 231 may be formed on the substrate 200. The second conductive layer 231 may conformally cover the upper surface of the interlayer dielectric 210 of the first and second regions A and B, the upper portion of the sidewalls of the second opening 212b, the second region lower gate electrode 212b and the bottom surface and sidewall of the first opening 212a. The thickness of the second conductive layer 231 may be less than one-half of the widths of the first and second openings 212a and 212b. Therefore, the second conductive layer 231 may partially fill the first and second openings 212a and 212b. Empty internal spaces in the first and second openings 212a and 212b may be defined which is surrounded by the second conductive layer 231.

The second conductive layer 231 may include a metal material having a work function required by a transistor to be formed on the first region A. The second conductive layer 231 may include the same material as that of the second conductive layer 230 that has been described above with reference to FIG. 3E.

Figure 5E:
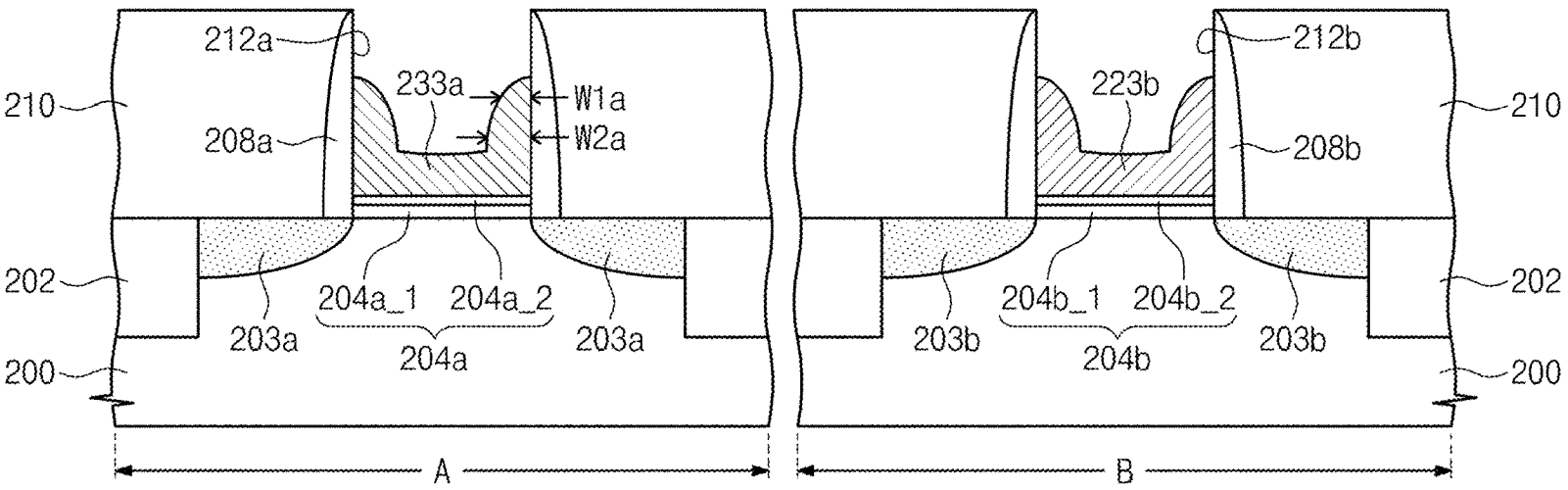

Referring to FIG. 5E, the second conductive layer 231 is etched, and thus, a first region lower gate electrode 233a may be formed. Etching the second conductive layer 231 may be performed by an inclined anisotropic etching process described in FIG. 2B. Therefore, the second conductive layer 231 may be removed which is disposed on the interlayer dielectric 210, the second conductive layer 231 may be removed which is formed on an upper portion of the sidewall of the first opening 212a, the second conductive layer 231 may be removed which is formed on the second opening 212b, and the second conductive layer 231 may remain which is formed on a lower portion of the sidewall of the first opening 212a and the bottom surface of the first opening 212a. Accordingly, the first region lower gate electrode 233a is formed which may cover the lower portion of the sidewall of the first opening 212a and the bottom surface of the first opening 212a, and the second region lower gate electrode 223b in the second opening 212b may be exposed.

The first region lower gate electrode 233a may include a bottom portion covering the bottom surface of the first opening 212a, and sidewall portions covering the lower portions of the sidewalls of the first opening 212a. The bottom portion of the first region lower gate electrode 233a may completely cover the bottom surface of the first opening 212a. The sidewall portions of the first region lower gate electrode 233a may extend upward in a vertical direction along the sidewalls of the first opening 212a from both ends of the bottom portion of the first region lower gate electrode 233a. The upper surfaces of the sidewall portions of the first region lower gate electrode 233a may be lower than the upper surface of the interlayer dielectric 210. Therefore, the sidewall portions of the first region lower gate electrode 233a may cover the lower portions of the sidewalls of the first opening 212a, and the upper portions of the sidewalls of the first opening 212a may be exposed. The width Wla of an upper portion of the sidewall portion of the first region lower gate electrode 233a may be narrower than the width W2a of a lower portion of the sidewall portion of the first region lower gate electrode 233a. The upper surfaces of the sidewall portions of the first region lower gate electrode 233a may be higher than the upper surface of the bottom portion of the first region lower gate electrode 233a.

Figure 5F:
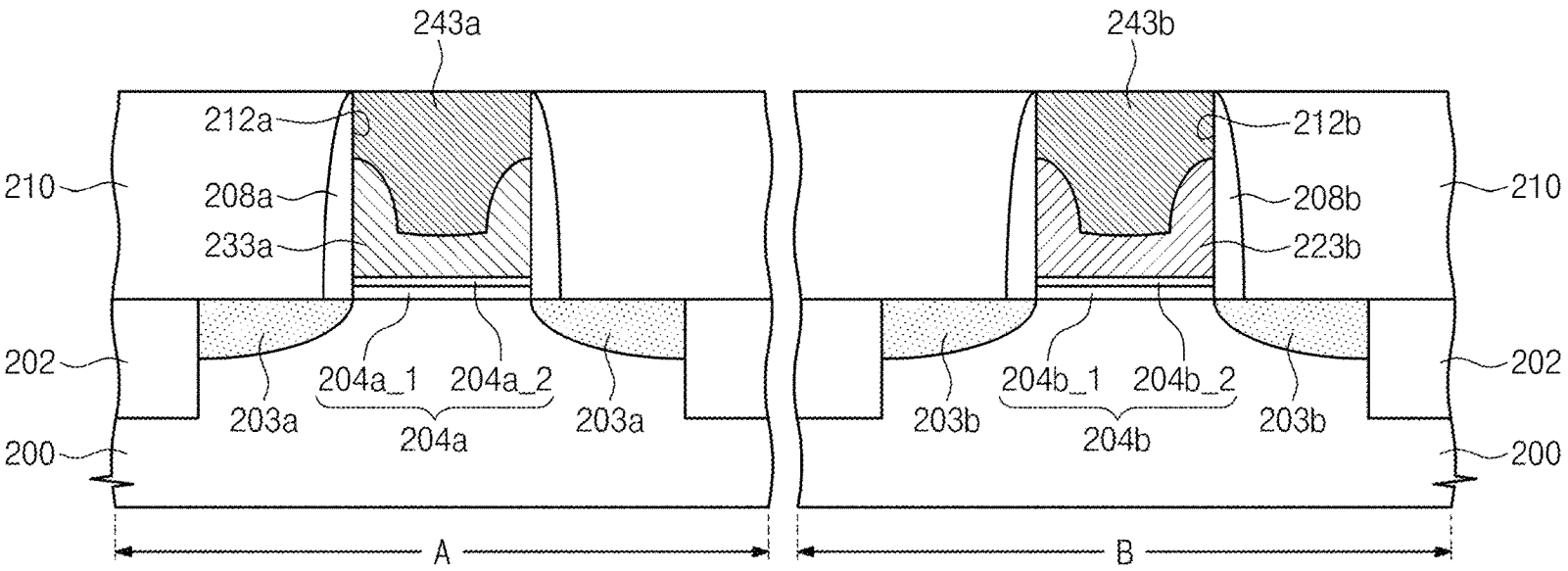

Referring to FIG. 5F, first and second region upper gate electrodes 243a and 243b may be formed which fill an empty region of the first opening 212a and an empty region of the second opening 212b, respectively. Forming the first and second region upper gate electrodes 243a and 243b may include forming a third conductive layer on the substrate 200 of the first and second regions A and B and performing a planarization process for the third conductive layer by using the upper surface of the interlayer dielectric 210 as an etch stop layer. Therefore, the third conductive layer is removed which is formed on the interlayer dielectric 210, the third conductive layer, which is formed in the first and second openings 212a and 212b, remains, and thus the first and second region upper gate electrodes 243a and 243b may be formed. The planarization process may be performed in an etch-back process or a CMP process. The third conductive layer may include the same material as that of the third conductive layer that has been described above with reference to FIG. 3G. The first and second region upper gate electrodes 243a and 243b may fill an internal space that is surrounded by the side walls of the first and second region lower gate electrodes 233a and 233b.

A semiconductor device that is formed by a modification example of the method of fabricating semiconductor device according to another example embodiment of the inventive concepts will be described below with reference to FIG. 5F.

Referring to FIG. 5F, the substrate 200 including the first and second regions A and B may include first and second active regions that are defined by the device isolation pattern 202. The first and second gate dielectric patterns 204a and 204b may be respectively disposed on the first and second regions A and B. The first and second region lower gate electrodes 232a and 222b may be disposed on the first and second gate dielectric patterns 204a and 204b, respectively. The first and second region upper gate electrodes 242a and 242b may be disposed on the first and second region lower gate electrodes 232a and 222b, respectively. First and second spacers 208a and 208b may be disposed on or cover both side walls of the first region gate electrodes 232a and 242a and the both-side walls of the second region gate electrodes 222b and 242b, respectively. First and second source and drain regions 203a and 203b may be disposed in the substrate 200 on both sides of the first region gate electrodes 232a and 242a and the substrate 200 on both side walls of the second region gate electrodes 222b and 242b.

The first region gate electrodes 233a and 243a may include the first region lower gate electrode 233a, and the first region upper gate electrode 243a on the first region lower gate electrode 233a. The first region lower gate electrode 233a and the first region upper gate electrode 243a may include different materials. For example, the first region lower gate electrode 233a may include a metal material for satisfying a work function required by a transistor to be formed on the first region A, and the first region upper gate electrode 243a may be formed of a material having a lower resistivity than the first region lower gate electrode 233a.

The second region gate electrodes 223b and 243b may include the second region lower gate electrode 223b, and the second region upper gate electrode 243b on the second region lower gate electrode 223b. The second region lower gate electrode 223b and the second region upper gate electrode 243b may include different materials. For example, the second region lower gate electrode 223b may include a metal material for satisfying a work function required by a transistor to be formed on the second region B, and the second region upper gate electrode 243b may be formed of a material having a lower resistivity than the second region lower gate electrode 223b.

Each of the first and second region lower gate electrodes 233a and 223b may include a bottom portion and sidewall portions. The bottom portion may be parallel to the substrate 200. The sidewall portions may extend in a direction vertical to the substrate 200 from both ends of the bottom portion. A width of an upper portion of the sidewall portion is narrower than a width of a lower portion of the sidewall portion. The first and second region upper gate electrodes 243a and 243b may fill a space surrounded by the sidewall portions of the first and second lower gate electrodes 233a and 223b, respectively.

The interlayer dielectric 210 may be disposed on the substrate 200 including the first and second regions A and B. The upper surface of the interlayer dielectric 210 and the upper surfaces of the first and second region upper gate electrodes 243a and 243b may be coplanar.

According to the method of fabricating a semiconductor device according to another example embodiment of the inventive concepts and its modification example, the first and second dummy gate patterns 206a and 206b are removed, and thus the first and second openings 212a and 212b are formed. The first and second gate dielectric patterns 204a and 204b and the first and second dummy gate patterns 206a and 206b are removed, and thus openings may be defined. This will be described below with reference to the accompanying drawings.

Figure 6A:
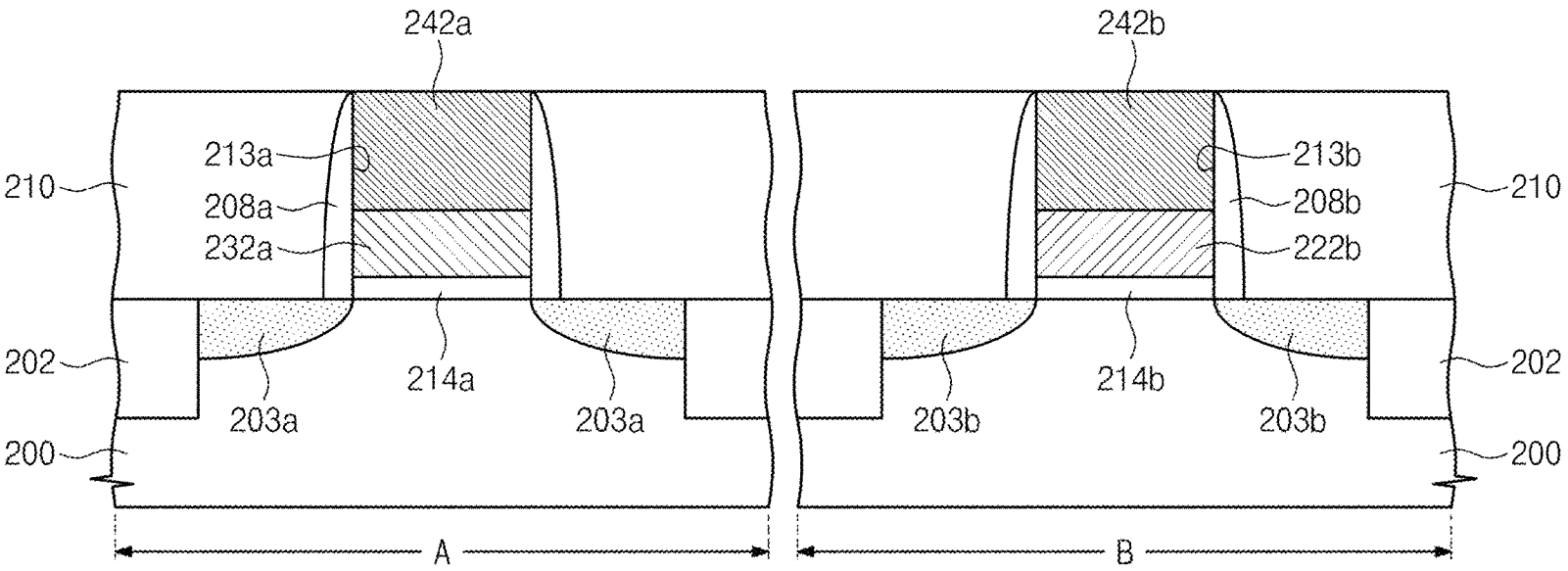
FIGS. 6A and 6B are cross-sectional views for describing other modification examples of the method of fabricating semiconductor device according to another example embodiment of the inventive concepts.
Figure 6B:
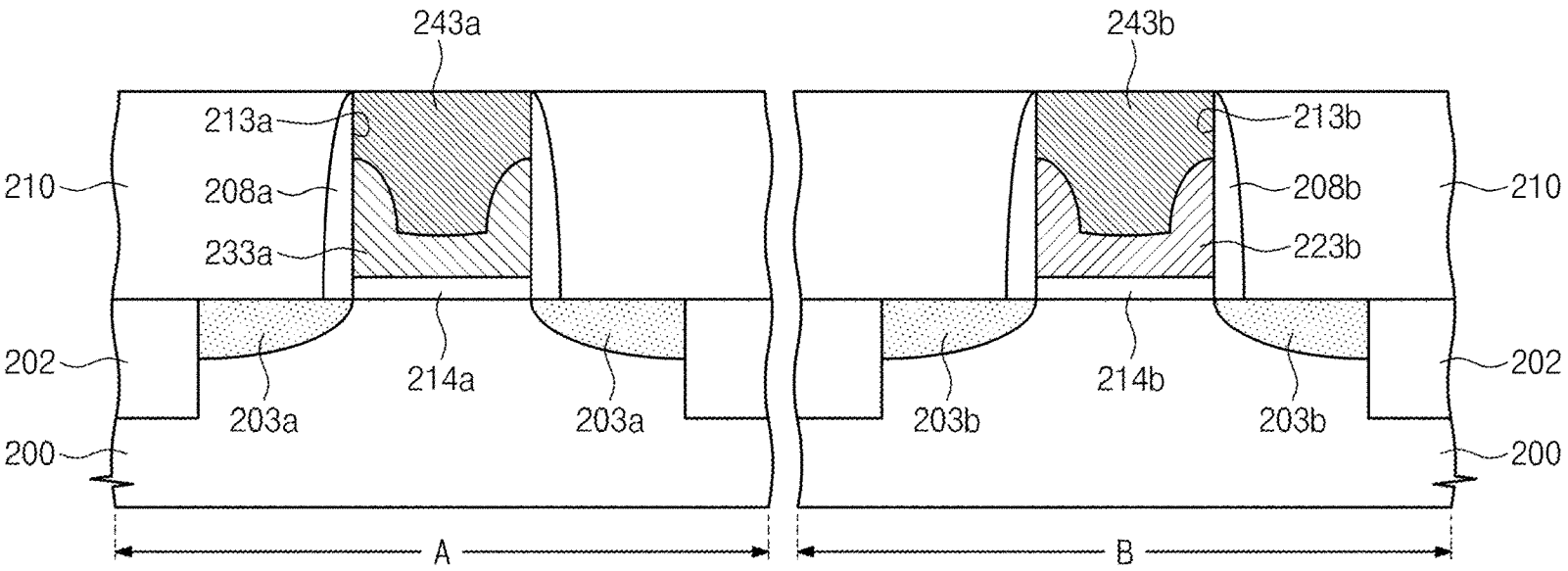

Other modification examples of the method of fabricating a semiconductor device according to another example embodiment of the inventive concepts will be described below. FIGS. 6A and 6B are cross-sectional views for describing other modification examples of the method of fabricating a semiconductor device according to another example embodiment of the inventive concepts.

Referring to FIGS. 6A and 6B, like the method that has been described above with reference to FIG. 4A, provided may be the substrate 200, the device isolation pattern 202, the source and drain regions 203a and 203b, the first and second gate dielectric patterns 204a and 204b, the first and second dummy gate patterns 206a and 206b, the first and second spacers 208a and 208b, and the interlayer dielectric 210.

The first and second dummy gate patterns 206a and 206b and the first and second gate dielectric patterns 204a and 204b may be removed. Removing the first and second dummy gate patterns 206a and 206b and the first and second gate dielectric patterns 204a and 204b may include etching the first and second dummy gate patterns 206a and 206b and the first and second gate dielectric patterns 204a and 204b by using the upper surface of the substrate 200 as an etch stop layer. The first dummy gate pattern 206a and the first gate dielectric pattern 204a are removed, and thus a first opening 213a may be formed for exposing the upper surface of the substrate 200 of the first region A. The second dummy gate pattern 206b and the second gate dielectric pattern 204b are removed, and thus a second opening 213b may be formed for exposing the upper surface of the substrate 200 of the second region B.

The bottom surfaces of the first and second openings 213a and 213b may be composed of the upper surface of the substrate 200, and the sidewalls of the first and second openings 213a and 213b may be composed of the sidewalls of the first and second spacers 208a and 208b.

The first and second openings 213a and 213b are formed, and the first and second gate dielectric patterns 214a and 214b, which may cover the exposed upper surface of the substrate 200, are formed in the first and second openings 213a and 213b, respectively. The first and second gate dielectric patterns 214a and 214b may completely cover the exposed upper surface of the substrate 200. The first and second gate dielectric patterns 214a and 214b may be formed as a thermal oxide layer. In another example embodiment, the first and second gate dielectric patterns 214a and 214b may be formed in a deposition process. In this case, unlike in the illustrated of FIGS. 6A and 6B, the first gate dielectric pattern 214a may be formed on the bottom surface and sidewall of the first opening 213a, and the second gate dielectric pattern 214b may be formed on the bottom surface and sidewall of the second opening 213b. In this case, the first and second gate dielectric patterns 214a and 214b may include the same materials as those of the first and second gate dielectric patterns 204a and 204b that have been described above with reference to FIG. 4A.

Subsequently, as illustrated in FIG. 6A, provided may be the method of fabricating semiconductor device that has been described above with reference to FIGS. 4B to 4G.

In another example embodiment, as illustrated in FIG. 6B, the first conductive layer 221 that has been described above with reference to FIG. 5A may be formed. In this case. provided may be the method of fabricating semiconductor device that has been described above with reference to FIGS. 5B to 5F.

The semiconductor devices according to example embodiments of the inventive concepts may be mounted with various types of semiconductor packages. For example, the semiconductor devices according to example embodiments of the inventive concepts may be packaged in package types such as Package on Package (PoP), Ball Grid Arrays (BGAs), Chip Scale Packages (CSPs), Plastic Leaded Chip Carrier (PLCC), Plastic Dual In-Line Package (PDIP), Die In Waffle Pack (DIWP), Die In Wafer Form (DIWF), Chip On Board (COB), Ceramic Dual In-Line Package (CERDIP), Plastic Metric Quad Flat Pack (MQFP), Thin Quad Flat Pack (TQFP), Small Outline Package (SOP), Shrink Small Outline Package (SSOP), Thin Small Outline Package (TSOP), Thin Quad Flat Pack (TQFP), System In Package (SIP), Multi Chip Package (MCP), Wafer Level Stack Package (WLSP), Die In Wafer Form (DIWF), Die On Waffle Package (DOWP), Wafer-level Fabricated Package (WFP) and Wafer-Level Processed Stack Package (WSP). Packages on which the semiconductor devices according to example embodiments of the inventive concepts are mounted may further include a controller or/and a logic device for controlling the semiconductor device.

According to example embodiments of the inventive concepts, the substrate including the first and second regions is prepared, and the first and second openings are provided in the first and second regions. The first conductive layer filling the first and second openings is etched to expose the bottom surface of the first opening, and the first conductive layer remains in the lower region of the second opening. The second conductive layer filling the first and second openings is provided, and the gate electrodes having the work function, which is required by the transistors to be formed in the first and second regions, can be provided. Accordingly, the semiconductor device having higher efficiency and higher reliability can be implemented.

The above-disclosed subject matter is to be considered illustrative and not restrictive, and the appended claims are intended to cover all such modifications, enhancements, and other example embodiments, which fall within the true spirit and scope of the inventive concepts. Thus, to the maximum extent allowed by law, the scope of the inventive concepts is to be determined by the broadest permissible interpretation of the following claims and their equivalents, and shall not be restricted or limited by the foregoing detailed description.

What is claimed is:

1. A semiconductor device comprising:

a gate dielectric pattern disposed on a substrate;

a lower gate electrode disposed on the gate dielectric pattern, the lower gate electrode including a bottom portion parallel to the substrate and sidewall portions extending in a vertical direction from both ends of the bottom portion; and an upper gate electrode disposed on the bottom portion and sidewall portions of the lower gate electrode, the upper gate electrode having a lower resistivity than the lower gate electrode, wherein the upper gate electrode is partially surrounded by the sidewall portions of the lower gate electrode, and wherein a width of upper portions of the sidewall portions of the lower gate electrode is narrower than a width of lower portions of the sidewall portions of the lower gate electrode.

2. The semiconductor device of claim 1, wherein the lower gate electrode is formed by a sub-etching process.

3. The semiconductor device of claim 1, wherein the gate dielectric [layer] *pattern* includes an insulating pattern and a metal compound pattern.

4. The semiconductor device of claim 3, wherein the insulating pattern includes one of at least a silicon oxide layer, a silicon nitride layer, and a silicon oxynitride layer.

5. The semiconductor device of claim 3, wherein the metal compound pattern includes one of at least a metal oxide layer, a metal silicide layer, a metal nitride layer, and a metal oxynitride layer.

*6. The semiconductor device of claim 1, further comprising spacers covering a sidewall of the lower gate electrode and a sidewall of the upper gate electrode.*

*7. A semiconductor device comprising:*

*a gate dielectric pattern disposed on a substrate;*

*a lower gate electrode disposed on the gate dielectric pattern, the lower gate electrode including a bottom portion parallel to the substrate and sidewall portions extending in a vertical direction from both ends of the bottom portion; and*

*an upper gate electrode disposed on the bottom portion and sidewall portions of the lower gate electrode, the upper gate electrode having a lower resistivity than the lower gate electrode,*

*wherein the upper gate electrode is partially surrounded by the sidewall portions of the lower gate electrode,*

*wherein a width of upper portions of the sidewall portions of the lower gate electrode is narrower than a width of lower portions of the sidewall portions of the lower gate electrode, and*

*wherein the lower gate electrode includes a metal-containing layer.*

*8. The semiconductor device of claim 7, wherein the lower gate electrode includes at least one of a titanium nitride layer, a titanium silicide layer, a titanium aluminum nitride layer, a tantalum nitride layer, a titanium tantalum nitride layer, a tantalum aluminum nitride layer, or a tantalum silicide nitride layer.*

*9. The semiconductor device of claim 7, wherein the lower gate electrode includes a titanium nitride layer.*

*10. The semiconductor device of claim 7, wherein the upper gate electrode includes at least one of aluminum, aluminum alloy, tungsten, and copper.*

*11. The semiconductor device of claim 7, wherein a work function of the lower gate electrode and a work function of the upper gate electrode are different from each other.*

*12. The semiconductor device of claim 7, further comprising:*

*spacers covering the sidewall portions of the lower gate electrode.*

*13. The semiconductor device of claim 7, further comprising:*

*source and drain regions in the substrate on both sides of the lower gate electrode.*

*14. The semiconductor device of claim 7, further comprising:*

*a metal compound pattern between the gate dielectric pattern and the lower gate electrode.*

*15. The semiconductor device of claim 14, wherein the metal compound pattern includes one of at least a metal oxide layer, a metal silicide layer, a metal nitride layer, and a metal oxynitride layer.*

*16. The semiconductor device of claim 7, wherein the gate dielectric pattern includes one of at least a silicon oxide layer, a silicon nitride layer, and a silicon oxynitride layer.*

*17. The semiconductor device of claim 7, further comprising:*

*an interlayer dielectric on the substrate, and*

*wherein the sidewall portions of the lower gate electrode have top surfaces lower than a top surface of the interlayer dielectric.*

*18. The semiconductor device of claim 17, wherein the top surface of the interlayer dielectric is coplanar with a top surface of the upper gate electrode.*

*19. The semiconductor device of claim 18, wherein the upper gate electrode includes tungsten.*

*20. The semiconductor device of claim 18, further comprising:*

*a metal compound pattern between the gate dielectric pattern and the lower gate electrode.*

*21. A semiconductor device comprising:*

*a gate dielectric pattern disposed on a substrate;*

*a lower metal gate electrode disposed on the gate dielectric pattern, the lower metal gate electrode including a bottom portion parallel to the substrate and sidewall portions extending in a vertical direction from both ends of the bottom portion; and*

*an upper gate electrode disposed on the bottom portion and sidewall portions of the lower metal gate electrode, the upper gate electrode having a lower resistivity than the lower metal gate electrode,*

*wherein the upper gate electrode is partially surrounded by the sidewall portions of the lower metal gate electrode, and*

*wherein a width of upper portions of the sidewall portions of the lower metal gate electrode is narrower than a width of lower portions of the sidewall portions of the lower metal gate electrode.*

*22. The semiconductor device of claim 21, wherein the lower metal gate electrode includes at least one of a titanium nitride layer, a titanium silicide layer, a titanium aluminum nitride layer, a tantalum nitride layer, a titanium tantalum nitride layer, a tantalum aluminum nitride layer, or a tantalum silicide nitride layer.*

*23. The semiconductor device of claim 21, wherein the upper gate electrode includes at least one of aluminum, aluminum alloy, tungsten, and copper.*

*24. The semiconductor device of claim 21, further comprising:*

*a metal compound pattern between the gate dielectric pattern and the lower metal gate electrode.*

*25. A semiconductor device comprising:*

*a gate dielectric pattern disposed on a substrate;*

*a lower gate electrode disposed on the gate dielectric pattern, the lower gate electrode including a bottom portion parallel to the substrate and sidewall portions extending in a vertical direction from both ends of the bottom portion; and*

*an upper gate electrode disposed on the bottom portion and sidewall portions of the lower gate electrode, the upper gate electrode having a lower resistivity than the lower gate electrode,*

*wherein the upper gate electrode is partially surrounded by the sidewall portions of the lower gate electrode,*

*wherein a width of upper portions of the sidewall portions of the lower gate electrode is narrower than a width of lower portions of the sidewall portions of the lower gate electrode, and*

*wherein the lower gate electrode comprise a titanium nitride layer.*

* * * * *